(12) United States Patent
Tomida et al.

(10) Patent No.: US 7,737,688 B2
(45) Date of Patent: Jun. 15, 2010

(54) MAGNETIC FIELD DETECTING APPARATUS

(75) Inventors: Takuya Tomida, Kanagawa (JP); Tadata Hatanaka, Kanagawa (JP); Shigeo Masai, Kanagawa (JP)

(73) Assignee: Panasonic Corporation, Osaka (JP)

( * ) Notice: Subject to any disclaimer, the term of this patent is extended or adjusted under 35 U.S.C. 154(b) by 93 days.

(21) Appl. No.: 12/182,739

(22) Filed: Jul. 30, 2008

(65) Prior Publication Data
US 2009/0033324 A1 Feb. 5, 2009

(30) Foreign Application Priority Data
Jul. 30, 2007 (JP) ............................ P.2007-198012

(51) Int. Cl.
*G01R 33/00* (2006.01)
*G01R 33/06* (2006.01)

(52) U.S. Cl. ...................................... 324/260; 324/251
(58) Field of Classification Search ................. 324/260, 324/251
See application file for complete search history.

(56) References Cited

U.S. PATENT DOCUMENTS 6,727,684 B2   4/2004   Hatanaka

FOREIGN PATENT DOCUMENTS

JP   2005-214900   8/2005
JP   2006-153699   6/2006

OTHER PUBLICATIONS

"Product Catalog for Hall IC series Application Notebook," issued from Handotai-Sha, Matsushita Electric Company, 2004.

*Primary Examiner*—Reena Aurora
(74) *Attorney, Agent, or Firm*—McDermott Will & Emery LLP

(57) ABSTRACT

The magnetic field detecting apparatus is provided with: a magnetic field detecting unit for outputting one of two signals having different potential levels from each other in response to a perpheral magnetic field; an energizing control unit for producing a periodic energizing control signal indicative of timing at which the magnetic field detecting unit is energized by employing a clock signal and another signal obtained by frequency-dividing, or frequency-multiplying the clock signal, and for supplying the produced energizing control signal to the magnetic field detecting unit; a first inverting unit for inverting the potential level of the output signal of the magnetic field detecting unit; and an energizing time period control unit for supplying a time period control signal to the energizing control unit, the time period control signal controlling the time period of the energizing control signal in response to the potential level of the output signal of the magnetic field detecting unit, and the potential level of the signal obtained by inverting the potential level of the output signal by the first inverting unit. The energizing time period control unit supplies any one of two pieces of the energizing control signals whose durations and time periods are different from each other, during which the magnetic field detecting unit is not energized, in response to the potential level of the time period control signal supplied from the energizing time period control unit.

17 Claims, 15 Drawing Sheets

MAGNETIC FIELD DETECTING APPARATUS

BACKGROUND OF THE INVENTION

1. Field of the Invention

The present invention is related to a magnetic field detecting apparatus for intermittently detecting a magnetic field, and also, related to an electronic appliance containing the above-described magnetic field detecting apparatus.

2. Description of the Related Art

As one of magnetic field detecting apparatuses, Hall ICs utilizing Hall-effect elements have been proposed. Also, among these Hall ICs, there are some Hall ICs equipped with intermittent driving functions in order to achieve low power consumption (refer to non-patent publication 1).

FIG. 16 is a block diagram for showing a Hall IC 10 equipped with an intermittent driving function. As shown in FIG. 16, the Hall IC 10 is provided with a power supply terminal 11, a GND terminal 13, an output terminal 15, an oscillator 101, a control logic circuit 103, a magnetic field detecting circuit 105, and an output inverter circuit 113. In the output inverter circuit 113, an NMOS 109 and a PMOS 111 have been series-connected to each other. A gate of the NMOS 109 and a gate of the PMOS 111 have been commonly connected to each other so as to constitute a common gate, and an output of the magnetic field detecting circuit 105 has been connected to the common gate An output terminal 15 has been connected to a common drain of the NMOS 109 and the PMOS 111.

FIG. 17(a) is a diagram for showing magnetic flux density "B" of a peripheral portion of the Hall IC 10; FIG. 17(b) is a diagram for representing a clock signal outputted from the oscillator 101; FIG. 17(c) is a diagram for indicating an output signal of a control logic circuit 103; and FIG. 17(d) is a diagram for showing an output signal outputted from the output terminal 15. Referring now to FIG. 16 and FIG. 17, a description is made of respective structural elements provided in the Hall IC 10 shown in FIG. 16.

The oscillator 101 outputs the clock signal having a constant time period "Tclk" represented in FIG. 17(b). The control logic circuit 103 frequency-divides the above-described clock signal, and then, performs a logic synthesizing operation with respect to the frequency-divided clock signals so as to output a signal having a constant time period "Ts" shown in FIG. 17(c). This time period "Ts" of the output signal is "n" times longer than the time period "Tclk" of the clock signal, while a time "Ton" of an H level and a time "Toff" of an L level are contained in 1 time period. The time "Ton" is very short with respect to 1 time period, whereas a major portion of 1 time period is the time "Toff."

The above-described signal outputted from the control logic circuit 103 is supplied to the magnetic field detecting circuit 105. The magnetic field detecting circuit 105 is energized in response to a signal supplied from the control logic circuit 103, namely, is energized during the time "Ton", and is not energized during the time "Toff." As a consequence, the magnetic field detecting circuit 105 performs an intermittent driving operation. As a result, low power consumption of the magnetic field detecting circuit 105 may be realized.

The magnetic field detecting circuit 105 contains a Hall-effect element 121, an amplifier 123, a comparator having a hysteresis characteristic (will be referred to as "hysteresis comparator" hereinafter) 125, and a latch circuit 127. The Hall-effect element 121 outputs a Hall-effect voltage in response to the magnetic flux density "B" (otherwise, magnetic field) around this Hall-effect element 121. The amplifier 123 amplifies the Hall voltage outputted from the Hall-effect element 121, and then, inputs the amplified Hall voltage to the hysteresis comparator 125.

The hysteresis comparator 125 compares the amplified Hall voltage with a reference voltage, and then, outputs a signal having such a level in response to high/low relationship between the amplified Hall voltage and the reference voltage, and the hysteresis. Namely, the hysteresis comparator 125 outputs a signal having an H level, or a signal having an L level.

The latch circuit 127 latches an output signal of the hysteresis comparator 125 obtained in the above-described time "Ton" during the above-described time "Toff." An output voltage of the latch circuit 127 is applied to the common gate of the output inverter circuit 113.

In response to the magnetic flux density "B", either a signal having an "H"-level voltage or a signal having an "L"-level voltage is outputted from the output terminal 15. For instance, in such a case that magnetic flux density around the Hall-effect element 121 is such a magnetic flux density "B" indicated in FIG. 17(a), such a signal having the voltage level represented in FIG. 17(d) is outputted from the output terminal 15.

Non-patent Publication 1: "Product Catalog for Hall IC series Application Notebook" issued from Handotai-Sha, Matsushita Electric Company, in 2004

In accordance with the above-explained Hall IC 10, since the magnetic field (magnetic flux density "B") is detected in the intermittent manner, the low power consumption thereof can be realized. However, the investigation of the Hall IC can be prolonged. In other words, as shown in FIG. 17(c), the detecting operation of the magnetic field is carried out only for the times "Ton" in an interval of the time period "Ts". As a consequence, when the investigating operation is performed during which the magnetic field is detected plural times, both the Hall IC 10 and the investigating apparatus are brought into waiting statuses for the times "Toff." As a result, the investigation time per a single piece of the Hall IC 10 is prolonged.

In order to shorten an investigation time of a Hall IC, the below-mentioned method for adding a test mode may be conceived. In this test mode, both the time "Toff" and the time period "Ts" represented in FIG. 17(c) are made shorter than those of the normal mode. However, due to such a reason that the above-described Hall IC is a miniature chip and the miniature Hall IC has no input pin for a mode selection purpose, the test mode can be very hardly added and set.

SUMMARY OF THE INVENTION

An object of the present invention is to provide a magnetic field detecting apparatus capable of performing an investigation within a short time without increasing a chip size and a total quantity of terminals, while power consumption of the magnetic field detecting apparatus is low.

The present invention provides such a magnetic field detecting apparatus comprising: a magnetic field detecting unit which is energized in response to a potential level of an input signal, and outputs any one of two signals having different potential levels from each other in response to a peripheral magnetic field; an energizing control unit for producing a periodic energizing control signal indicative of timing at which the magnetic field detecting unit is energized by employing a clock signal and another signal obtained by frequency-dividing, or frequency-multiplying the clock signal, and for supplying the produced energizing control signal to the magnetic field detecting unit; a first inverting unit for inverting the potential level of the output signal of the magnetic field detecting unit; and an energizing time period control unit for supplying a time period control signal to the energizing control unit, the time period control signal controlling the time period of the energizing control signal in response to the potential level of the output signal of the magnetic field detecting unit, and the potential level of the signal obtained by inverting the potential level of the output signal by the first inverting unit; in which the energizing time period control unit supplies any one of two pieces of the energizing control signals whose durations and time periods are different from each other, during which the magnetic field detecting unit is not energized, in response to the potential level of the time period control signal supplied from the energizing time period control unit.

In the above-described magnetic field detecting apparatus, as operation modes of the magnetic field detecting apparatus, a test mode when the operation of the magnetic field detecting apparatus is investigated, and a normal mode when the magnetic field detecting apparatus is operated under normal condition are prepared; and also, both a non-energizing duration and a time period of the energizing control signal when the test mode is selected are shorter than those of the energizing control signal when the normal mode is selected.

In the above-described magnetic field detecting apparatus, both a signal responding to the potential level of the output signal from the magnetic field detecting unit, and another signal responding to the potential level of the signal obtained by inverting the potential level of the output signal by the first inverting unit are inputted to the energizing time period control unit; and also, when the potential levels of the two signals entered to the energizing time period control unit are forcibly set to the same potential only for a predetermined time during the normal mode, the energizing time period control unit supplies a time period control signal having a potential level which is different from the potential level of the time period control signal during the normal mode to the energizing control unit, so that the operation mode of the magnetic field detecting apparatus is transferred from the normal mode to the test mode.

Also, the present invention provides such a magnetic field detecting apparatus comprising: a magnetic field detecting unit which is energized in response to a potential level of an input signal, and outputs any one of two signals having different potential levels from each other in response to a peripheral magnetic field of an S pole, and also, outputs any one of the two signals having the different potential levels from each other in response to a peripheral magnetic field of an N pole; an energizing control unit for producing a periodic energizing control signal indicative of timing of which the magnetic field detecting unit is energized by employing a clock signal and another signal obtained by frequency-dividing, or frequency-multiplying the clock signal, and for supplying the produced energizing control signal to the magnetic field detecting unit; and an energizing time period control unit for supplying a time period control signal to the energizing control unit, the time period control signal controlling the time period of the energizing control signal in response to both the potential level of the output signal of the magnetic field detecting unit, which responds to the magnetic field of the S pole, and the potential level of the signal of the magnetic field detecting unit, which responds to the magnetic field of the N pole; and in which the energizing time period control unit supplies any one of two pieces of the energizing control signals whose durations and time periods are different from each other, during which the magnetic field detecting unit is not energized in response to the potential level of the time period control signal supplied from the energizing time period control unit.

In the above-described magnetic field detecting apparatus, as operation modes of the magnetic field detecting apparatus, a test mode when the operation of the magnetic field detecting apparatus is investigated, and a normal mode when the magnetic field detecting apparatus is operated under normal condition are prepared; and also, both a non-energizing duration and a time period of the energizing control signal when the test mode is selected are shorter than those of the energizing control signal when the normal mode is selected.

In the above-described magnetic field detecting apparatus, both a signal responding to the potential level of the output signal from the magnetic field detecting unit, which is produced in response to the magnetic field of the S pole, and another signal responding to the potential level of the output signal from the magnetic field detecting unit, which is produced in response to the magnetic field of the N pole are inputted to the energizing time period control unit; and also, when the potential levels of the two signals entered to the energizing time period control unit are forcibly set to the same potential only for a predetermined time during the normal mode, the energizing time period control unit supplies a time period control signal having a potential level which is different from the potential level of the time period control signal during the normal mode to the energizing control unit, so that the operation mode of the magnetic field detecting apparatus is transferred from the normal mode to the test mode.

In the above-described magnetic field detecting apparatus, the energizing control unit includes a counter for measuring a time elapsed after the operation mode of the magnetic field detecting apparatus has been transferred to the test mode; and when a predetermined time has elapsed, the energizing control unit initializes the energizing time period control unit.

In the above-described magnetic field detecting apparatus, the energizing time period control unit is comprised of: a logic gate for outputting a signal having an "H" level when the potential levels of the two signals entered to the energizing time period control unit are set to the same potentials; a first flip-flop having an input terminal into which the signal outputted from the logic gate is entered; a second inverting unit for inverting a potential level of a signal outputted from the first flip-flop; and a second flip-flop having a reset terminal, a clock terminal into which the output signal of the first flip flop is inputted and an input terminal into which the "H"-level signal is continuously inputted; and also, the time period control signal is an output signal of the second flip-flop.

In the above-described magnetic field detecting apparatus, the energizing time period control unit is comprised of: a logic gate for outputting a signal having an "H" level when the potential levels of the two signals entered to the energizing time period control unit are set to the same potentials; a first flip-flop having an input terminal into which the signal outputted from the logic gate is entered; a second inverting unit for inverting a potential level of a signal outputted from the first flip-flop; a second flip-flop having an input terminal into which the output signal of the first flip-flop is entered; and a third flip-flop having a reset terminal, a clock terminal into which the output signal of the second flip-flop is inputted, and an input terminal into which the "H"-level signal is continuously inputted; and also, the time period control signal is an output signal of the third flip-flop.

In the above-described magnetic field detecting apparatus, the production of the energizing control signal by the energizing control unit is initialized, or the initializing operation thereof is released in response to a potential level of a signal obtained by inverting the potential level of the output signal of the first flip-flop by the second inverting unit.

In the above-described magnetic field detecting apparatus, the logic gate is a NOR gate, or an AND gate.

Also, the present invention provides such a magnetic field detecting apparatus comprising: a magnetic field detecting unit which is energized in response to a potential level of an input signal, and outputs any one of two signals having different potential levels from each other in response to a peripheral magnetic field; an energizing control unit for producing a periodic energizing control signal indicative of timing of which the magnetic field detecting unit is energized by employing a clock signal and another signal obtained by frequency-dividing, or frequency-multiplying the clock signal, and for supplying the produced energizing control signal to the magnetic field detecting unit; and a comparing unit for comparing a potential responding to a power supply voltage with a reference potential, and for outputting any one of two signals having different potential levels from each other in response to large/small relationship between the potential and the reference potential; in which the energizing time period control unit supplies any one of two pieces of the energizing control signals whose durations and time periods are different from each other, during which the magnetic field detecting unit is not energized in response to the potential level of the signal outputted from the comparing unit.

In the above-described magnetic field detecting apparatus, as operation modes of the magnetic field detecting apparatus, a test mode when the operation of the magnetic field detecting apparatus is investigated, and a normal mode when the magnetic field detecting apparatus is operated under normal condition are prepared; and also, both a non-energizing duration and a time period of the energizing control signal when the test mode is selected are shorter than those of the energizing control signal when the normal mode is selected.

In the above-described magnetic field detecting apparatus, a power supply voltage during the test mode is higher than a power supply voltage during the normal mode; and also, when a potential responding to the power supply voltage becomes higher than the reference potential, the operation mode of the magnetic field detecting apparatus is transferred from the normal mode to the test mode.

Further, the present invention provides an electronic appliance featured by comprising the above-described magnetic field detecting apparatus.

In accordance with the present invention, it is possible to provide the magnetic field detecting apparatus capable of performing an investigation within a short time without increasing a chip size and a total quantity of terminals, while power consumption of the magnetic field detecting apparatus is low.

DESCRIPTION OF THE PREFERRED EMBODIMENTS

Referring now to drawings, a description is made of embodiment modes of the present invention. It should be understood that as one example of magnetic field detecting apparatuses, a Hall IC will be exemplified in the below-mentioned descriptions.

First Embodiment Mode

Figure 1:
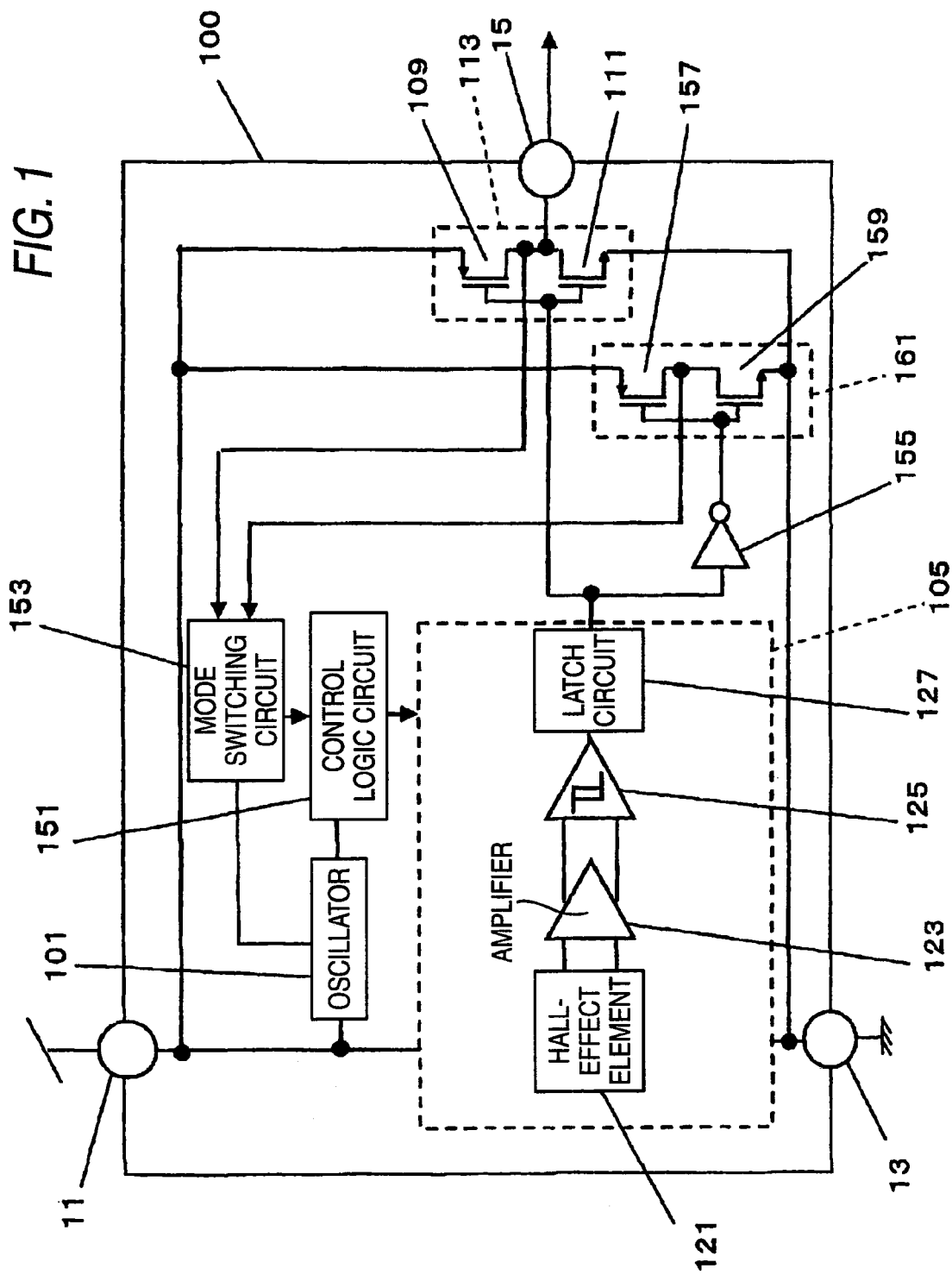
FIG. 1 is a block diagram for indicating a Hall IC 100 according to a first embodiment mode of the present invention.
Figure 16:
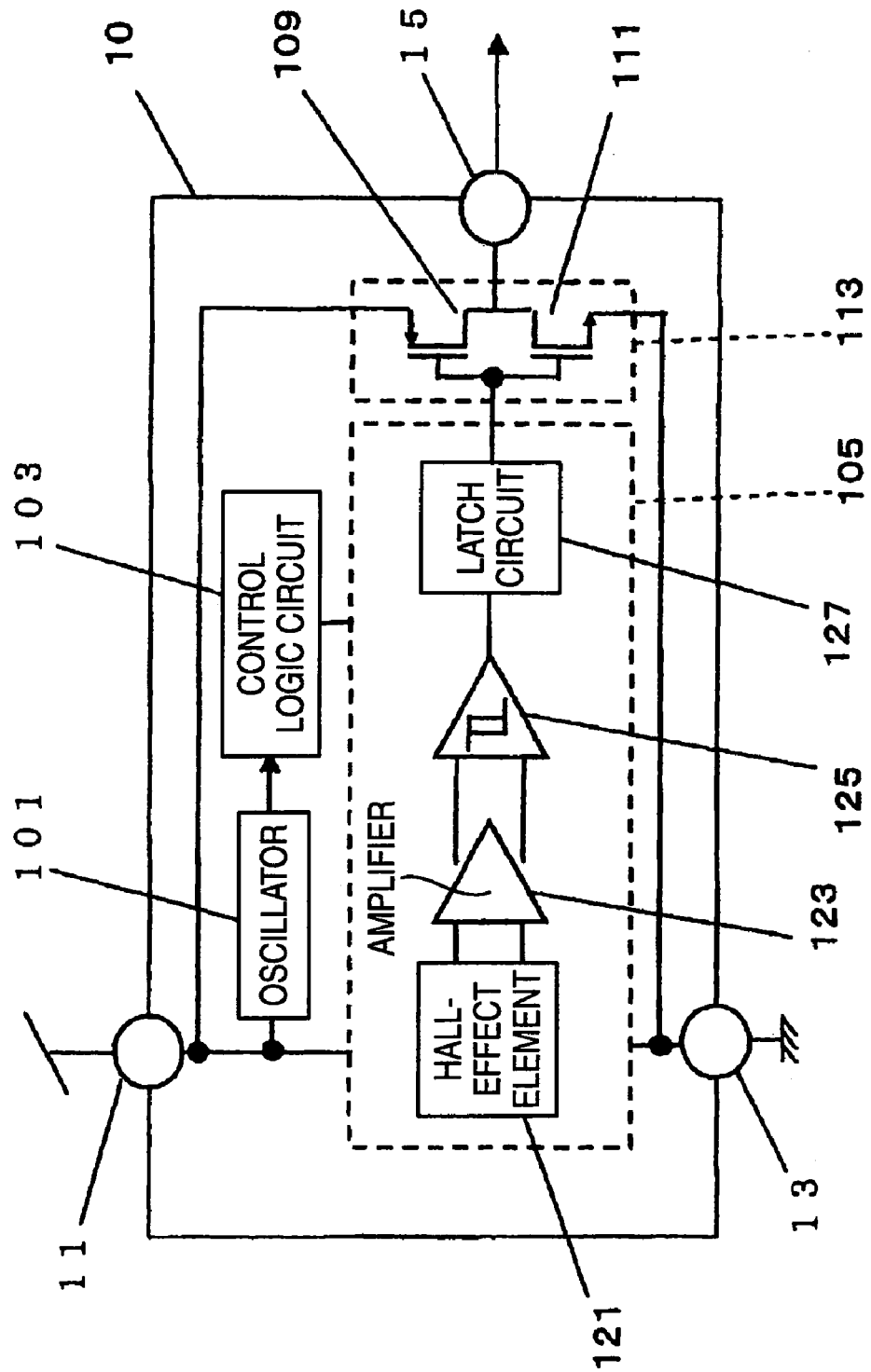
FIG. 16 is a block diagram for indicating the Hall IC 10 equipped with the intermittent driving function.
Figure 17:
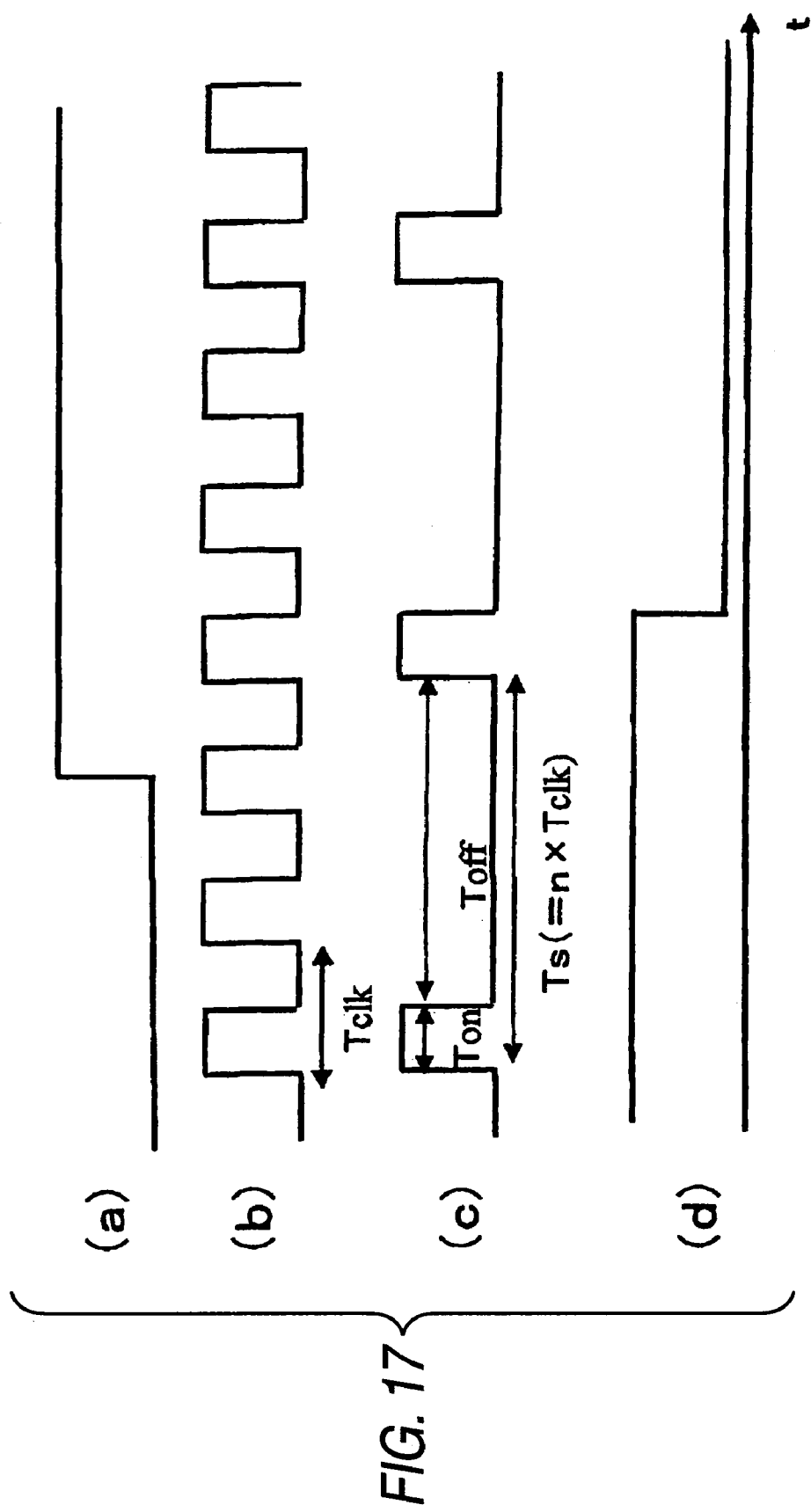
FIG. 17(a) is a diagram for showing the magnetic flux density "B" as to the peripheral area of the Hall IC 10.
FIG. 17(b) is a diagram for representing the clock signal outputted from the oscillator 101.
FIG. 17(c) is a diagram for showing the output signal of the control logic circuit 103.
FIG. 17(d) is a diagram for indicating the output signal outputted from the output terminal 15.

FIG. 1 is a block diagram for showing a Hall IC 100 according to a first embodiment mode of the present invention. It should also be noted that in FIG. 1, the same reference numerals shown in FIG. 1 have been applied to structural elements similar to those provided in the Hall IC 10 of FIG. 16, which have been described in the Background Art. As indicated in FIG. 1, the Hall IC 100 of the first embodiment mode is equipped with a power supply terminal 11, a GND terminal 13, an output terminal 15, an oscillator 101, a control logic circuit 151, a magnetic field detecting circuit 105, a mode switching circuit 153, an output inverter circuit 113, an inverter 155, and another output inverter unit 161. In the output inverter circuit 113, an NMOS 109 and a PMOS 111 have been series-connected to each other. In the output inverter circuit 161, an NMOS 157 and a PMOS 159 have been series-connected to each other.

A gate of the NMOS 109 and a gate of the PMOS 111 have been commonly connected to each other so as to constitute a common gate, and an output of the magnetic field detecting circuit 105 has been connected to the common gate. Also, the output inverter circuit 113 has a common drain structure of the NMOS 109 and the PMOS 111, while both the output terminal 15 and the mode switching circuit 153 have been connected to this common drain.

Similarly, a gate of the NMOS 157 and a gate of the PMOS 159 have been commonly connected to each other, while an output of the magnetic field detecting circuit 105 has been connected via the inverter 155 to this common gate. Also, the output inverter circuit 161 has a common drain structure of the NMOS 157 and the PMOS 159, the mode switching circuit 153 has been connected to the above-described common drain.

Figure 2:
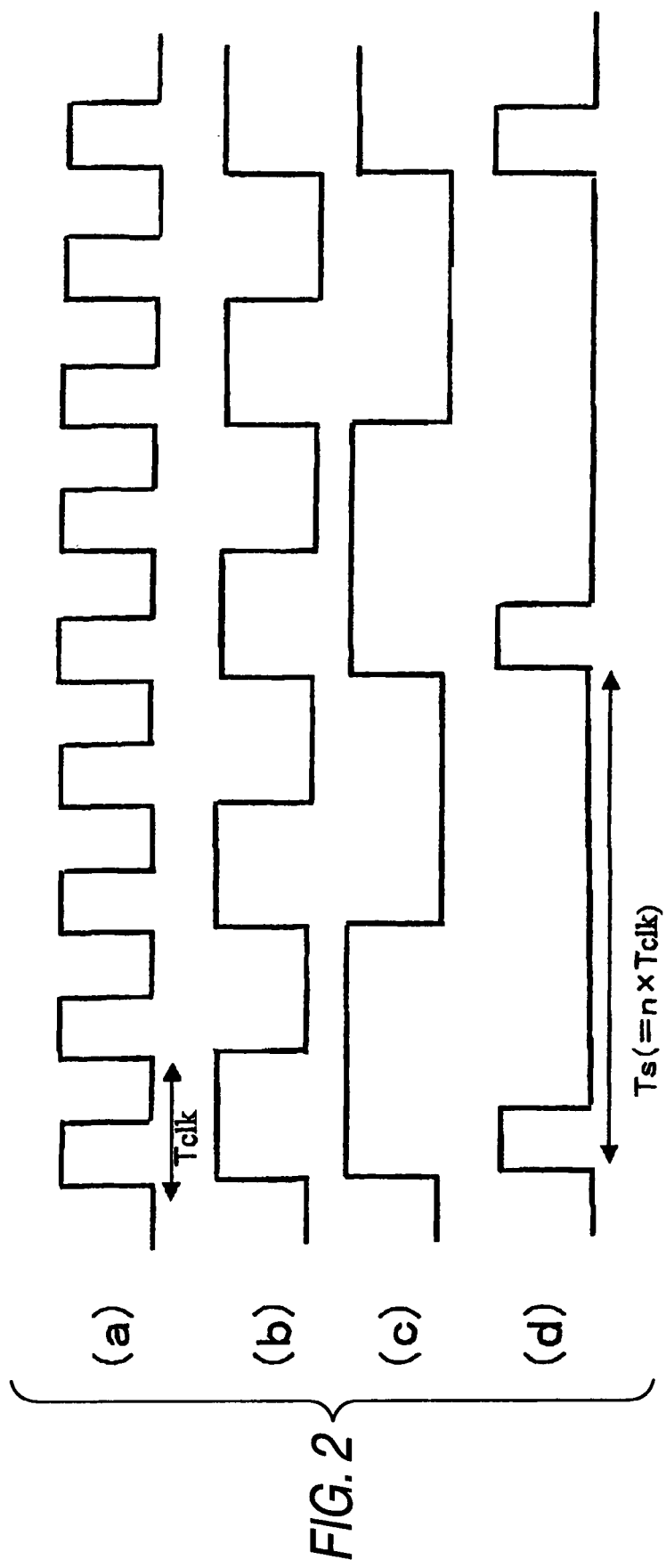
FIG. 2(a) is a diagram for showing a clock signal outputted form an oscillator 101.
FIG. 2(b) is a diagram for indicating a first frequency-divided signal produced by frequency-dividing the clock signal in a frequency dividing ratio of 1/2 by a control logic circuit 151.
FIG. 2(c) is a diagram for indicating a second frequency-divided signal produced by frequency-dividing the clock signal in a frequency dividing ratio of 1/4 by the control logic circuit 151.
FIG. 2(d) is a diagram for showing an AND-gated output signal among the clock signal, the first frequency-divided signal, and the second frequency-divided signal when the operation mode of the Hall IC 100 is selected to a normal mode.
Figure 3:
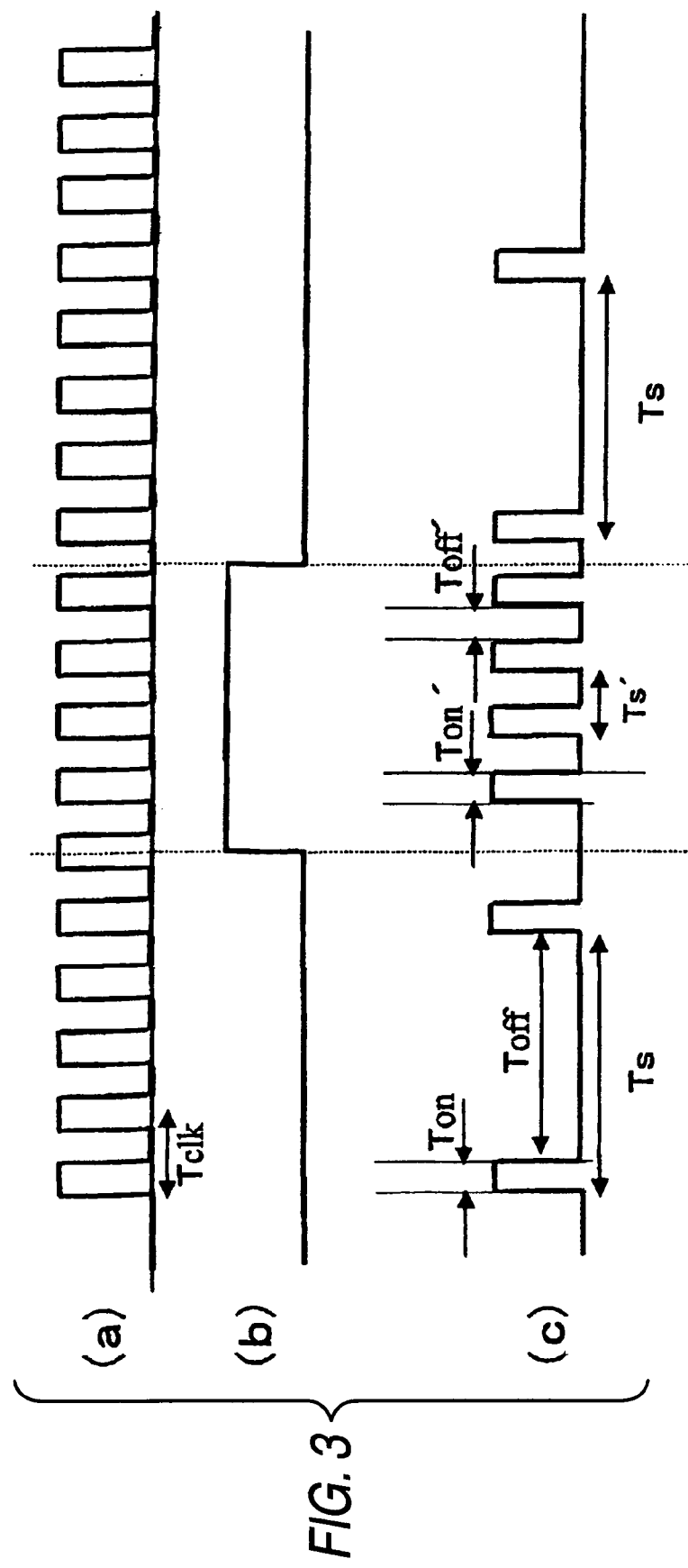
FIG. 3(a) is a diagram for representing a clock signal.
FIG. 3(b) is a diagram for showing a mode setting signal outputted from a mode switching circuit 153.
FIG. 3(c) is a diagram for representing an output signal of the control logic circuit 151 in response to the mode setting signal when the Hall IC 100 has been set to either the normal mode or a test mode.

FIG. 2(*a*) is a diagram for showing a clock signal outputted from the oscillator 101; FIG. 2(*b*) is a diagram for indicating a first frequency-divided signal which is produced by frequency-dividing the clock signal by the control logic circuit 151 in a frequency dividing ratio of 1/2; FIG. 2(*c*) is a diagram for indicating a second frequency-divided signal which is produced by frequency-dividing the clock signal by the control logic circuit 151 in a frequency dividing ratio of 1/4; and FIG. 2(*d*) is a diagram for representing such an output signal produced by AND-gating the clock signal, the first frequency-dividing signal, and the second frequency-dividing signal when the Hall IC 100 is operated in a normal mode. Also, FIG. 3(*a*) is a diagram for showing a clock signal; FIG. 3(*b*) is a diagram for indicating a mode setting signal outputted from the mode switching circuit 153; and FIG. 3(*c*) is a diagram for indicating an output signal of the control logic circuit 151 in response to the mode setting signal when the Hall IC 100 has been set to either the normal mode or the test mode. Referring now to FIG. 1 to FIG. 3, a description is made of respective structural elements provided in the Hall IC 100 shown in FIG. 1, according to the first embodiment mode.

The oscillator 101 outputs the clock signal having a constant time period "Tclk" represented in FIG. 2(*a*) and FIG. 3(*a*). The control logic circuit 151 frequency-divides, or frequency-multiplies the above-described clock signal, and then, performs a logic synthesizing operation with respect to the frequency-divided, or the frequency-multiplied clock signals so as to output a signal having a constant time period "Ts" shown in FIG. 2(*d*). In the below-mentioned description, either the frequency-dividing operation or the frequency-multiplying operation and the logic synthesizing operation of the clock signal by the control logic circuit 151 will be referred to as a "timing producing logic process operation." The time period "Ts" of the signal outputted from the control logic circuit 151 is "n" times longer than the time period "Tclk" of the clock signal, while symbol "n" indicates either a frequency dividing ratio or a frequency multiplying ratio, and a time "Ton" of an "H" level and a time "Toff" of an "L" level are contained in 1 time period.

For instance, as shown in FIG. 2, when the operation mode of the Hall IC 100 is switched to the normal mode, the control logic circuit 151 AND-gates the two frequency-divided signals and the clock signal so as to output such a signal having the time period "Ts" which is 4 times longer than the time period "Tclk" of the clock signal. These two frequency-divided signals have been obtained by frequency-dividing the clock signal based upon the frequency dividing ratios of 1/2 and 1/4 respectively. 1 time period of this output signal contains a time "Ton" (=Tclk/2) having an "H" level, and a time "Toff" (=7n×Tclk/8) having an "L" level.

The control logic circuit 151 becomes the test mode while a mode setting signal having a H level (will be discussed later) is being inputted thereto from the mode switching circuit 153. In the test mode, the control logic circuit 151 frequency-divides, or frequency-multiplies the clock signal in either a frequency dividing ratio or a frequency multiplying ratio, which is different from either the frequency dividing ratio or the frequency multiplying ratio which are employed in the normal mode, and then, performs a logic synthesizing operation with respect to the frequency-divided, or the frequency-multiplied clock signals so as to output such a signal having a time period "Ts'" which is shorter than the time period "Ts" indicated in FIG. 2(*d*), or FIG. 3(*c*). For instance, in the example shown in FIG. 3(*c*), the time period "Ts'" of the signal outputted from the control logic circuit 151 during the test mode is equal to the time period "Tclk" of the clock signal; and both a time "Ton'" of an "H" level and a time "Toff'" of an "L" level are equal to a half time period (Tclk/2) of the clock signal respectively.

As previously described, when the test mode is selected, the time "Toff'" for the "L" level of the signal outputted from the control logic circuit 151 is made shorter than the time "Toff" for the "L" level of the signal during the normal mode. As a result, the time period "Ts'" of the signal outputted from the control logic circuit 151 during the test mode becomes shorter than the time period "Ts" during the normal mode. It should also be understood that the normal mode implies such an operation mode for operating the Hall IC 100 of the first embodiment mode, whereas the test mode implies such an operation mode for investigating the operation of the Hall IC 100.

The above-described signal outputted from the control logic circuit 151 is supplied to the magnetic field detecting circuit 105. The magnetic field detecting circuit 105 is energized in response to a potential level of a signal supplied from the control logic circuit 151, namely is energized during the time "Ton" having the "H" level and is not energized during the time "Toff" of the "L" level. As a consequence, the magnetic field detecting circuit 105 performs an intermittent driving operation. The magnetic field detecting circuit 105 contains a Hall-effect element 121, an amplifier 123, a comparator having a hysteresis characteristic (will be referred to as "hysteresis comparator" hereinafter) 125, and a latch circuit 127. The Hall-effect element 121 outputs a Hall-effect voltage in response to the magnetic flux density "B" (otherwise, magnetic field) around this Hall-effect element 121. Since a Hall voltage "Vh" is directly proportional to a current "Ihall" flowing through the Hall-effect element 121, this Hall voltage "Vh" is expressed by the below-mentioned formula:

$$Vh = K \times B \times Ihall$$

(symbol "K" indicates proportional constant).

The amplifier 123 amplifies the Hall voltage outputted from the Hall-effect element 121, and then, outputs the amplified Hall voltage to the hysteresis comparator 125. The hysteresis comparator 125 compares the amplified Hall voltage with a reference voltage, and then, outputs a signal having such a level in response to high/low relationship between the amplified Hall voltage and the reference voltage, and the hysteresis. Namely, the hysteresis comparator 125 outputs a signal having an "H" level, or a signal having an "L" level. The latch circuit 127 latches an output signal of the hysteresis comparator 125 obtained in the above-described time "Ton", or "Ton'" during the above-described time either "Toff" or "Toff'." An output signal of the latch circuit 127 is applied to the common gate of the output inverter circuit 113, and the inverter 155.

Figure 4:
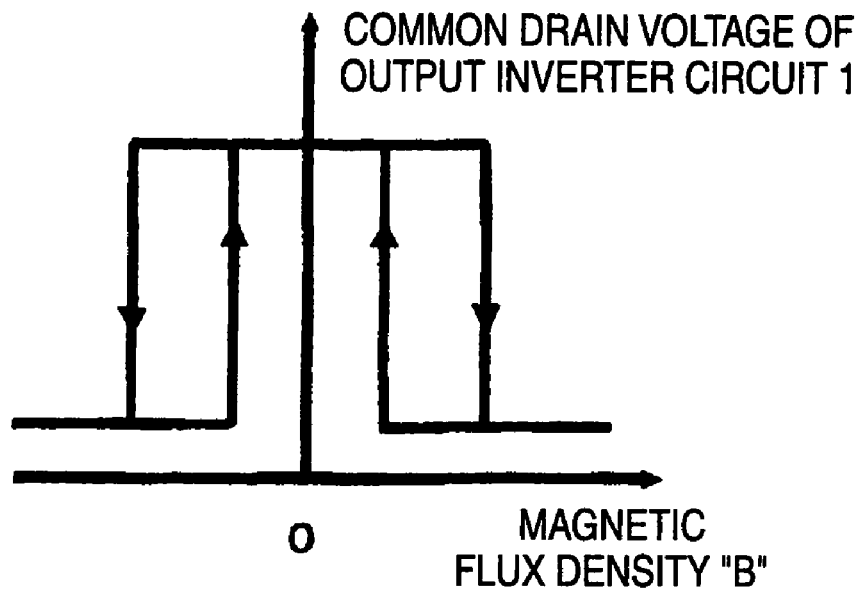
FIG. 4 is a diagram for representing a characteristic of a common drain voltage of an output inverter circuit 113 in response to magnetic flux density "B."

Either a voltage signal having an "H" level or a voltage signal having an "L" level is outputted from the output terminal 15 connected to the common drain of the output inverter circuit 113 in response to the magnetic flux density "B." FIG. 4 is a diagram for representing a characteristic of the common drain voltage of the output inverter circuit 113 in response to the magnetic flux density "B." An ordinate of a graph shown in FIG. 4 represents the common drain voltage of the output inverter circuit 113, whereas an abscissa thereof represents the magnetic flux density "B." Due to the hysteresis function of the hysteresis comparator 125 contained in the magnetic field detecting circuit 105, the above-described common drain voltage has such a characteristic represented in FIG. 4. It should also be noted that since the mode switching circuit 153 has been connected to the common drain of the output inverter circuit 113, the above-described common drain voltage is applied to the mode switching circuit 153.

Figure 5:
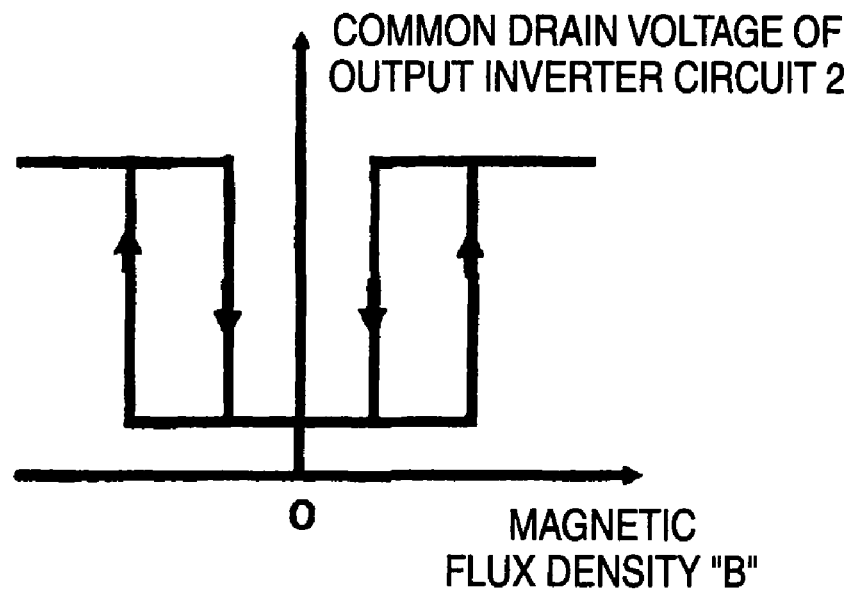
FIG. 5 is a diagram for representing a characteristic of a common drain voltage of an output inverter circuit 161 in response to magnetic flux density "B."

A voltage produced by inverting the output voltage of the latch circuit 127 by the inverter 155 is applied to the common gate of the output inverter circuit 161. FIG. 5 is a diagram for representing a characteristic of the common drain voltage of the output inverter circuit 161 in response to the magnetic flux density "B." An ordinate of a graph shown in FIG. 5 represents the common drain voltage of the output inverter circuit 161, whereas an abscissa thereof represents the magnetic flux density "B." As shown in FIG. 5, the above-described common drain voltage of the output inverter circuit 161 is opposite to the common drain voltage of the output inverter circuit 113 shown in FIG. 4. It should also be noted that since the mode switching circuit 153 has been connected to the common drain of the output inverter circuit 161, the above-described common drain voltage is applied to the mode switching circuit 153.

Figure 6:
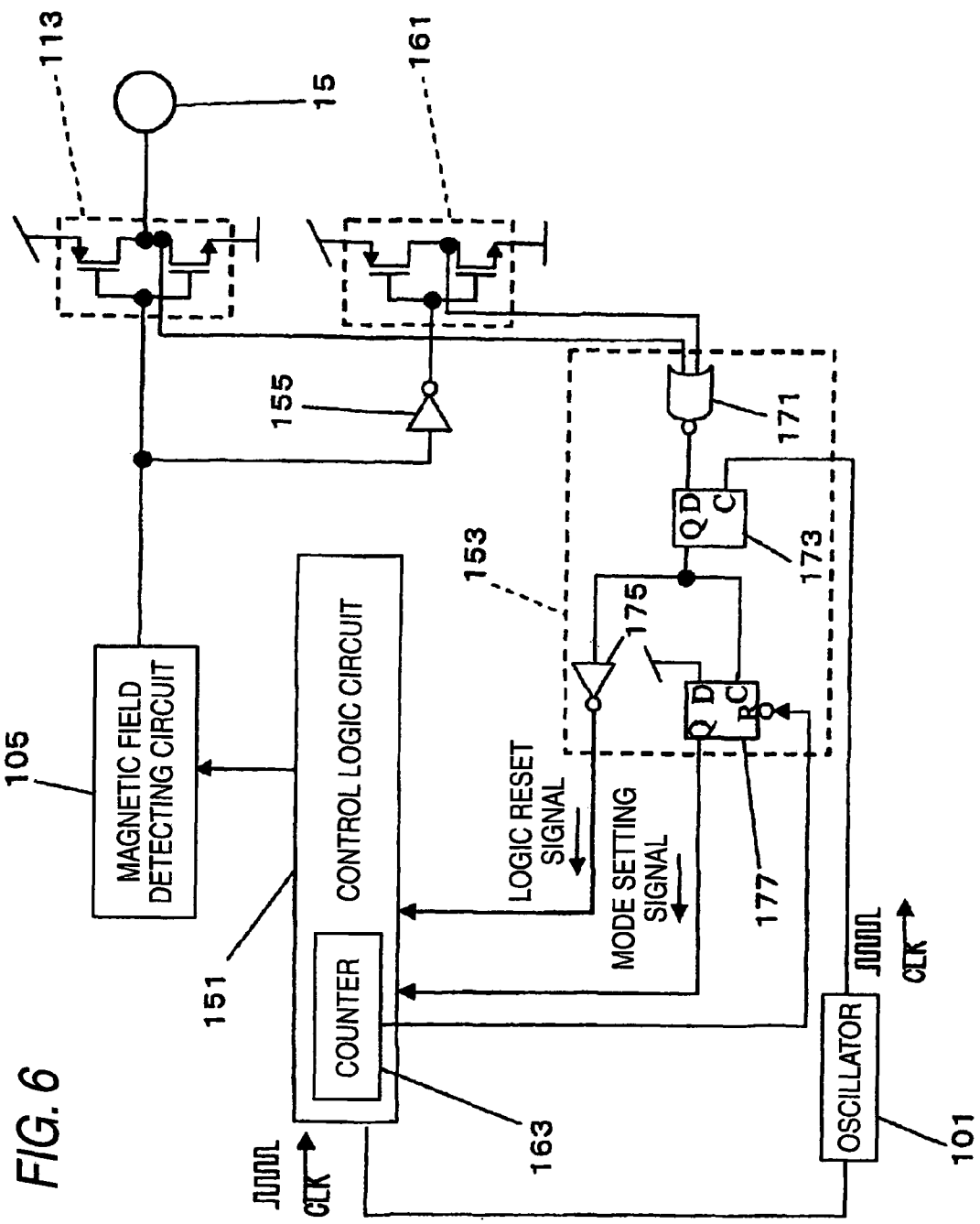
FIG. 6 is a block diagram for indicating a portion of the Hall IC 100 of the first embodiment mode, while an internal arrangement of a mode switching circuit 153 is mainly provided.

FIG. 6 is a block diagram for indicating a portion of the Hall IC 100 according to the first embodiment mode, while an internal arrangement of the mode switching circuit 153 is mainly represented. As shown in FIG. 6, the mode switching circuit 153 contains an NOR gate (will be simply referred to as "NOR" hereinafter) 171, a first D flip-flop (will be referred to as "first DFF" hereinafter) 173, an inverter 175, and a second D flip-flop (will be referred to as "second DFF" hereinafter) 177. It should also be understood that the second DFF 177 has a reset terminal. Two input potentials of the NOR 171 correspond to the common drain voltage of the output inverter circuit 113, and the common drain voltage of the output inverter circuit 161 respectively.

An output signal of the NOR 171 is inputted to the first DFF 173, and an output signal of the first DFF 173 is inputted to the inverter 175 and a clock terminal of the second DFF 177. The output signal of the first DFF 173 which has been inverted by the inverter 175 is supplied as a logic reset signal to the control logic circuit 151. An H-level potential is continuously applied to the input terminal of the second DFF 177. An output signal of the second DFF 177 is supplied as a mode setting signal to the control logic circuit 151, while the mode setting signal instructs setting of an operation mode. It should also be understood that the signal level of the mode setting signal when the normal mode is set is an "L" level, whereas the signal level of the mode setting signal when the test mode is set is an "H" level.

A signal supplied from a counter 163 provided inside the control logic circuit 151 is entered to a reset terminal of the second DFF 177. The counter 163 measures an elapsed time after the control logic circuit 151 has received the mode setting signal having the "H" level, and then, the counter 163 outputs an H-level signal when a predetermined time has passed. When the H-level signal is inputted to the reset terminal, the second DFF 177 is reset.

Next, a description is made of operations of the mode switching circuit 153 shown in FIG. 6 when the operation mode of the Hall IC 100 is transferred from the normal mode to the test mode, and is again returned to the normal mode.

Two sets of the input potentials of the NOR 171 are opposite to each other when the normal mode is selected, so that the output signal of the NOR 171 is an "L" level. In order to transfer the operation mode to the test mode, both the common drain voltage of the output inverter circuit 113 and the common drain voltage of the output inverter circuit 161 are forcibly set to "L" levels. It should also be noted that since the above-described inverter 155 has been provided in the Hall IC 100 of this first embodiment mode, there is no possibility that these common drain voltages are equal to each other under the normal condition. When these common drains are grounded so as to forcibly set the levels thereof to "L" levels, these two input potentials of the NOR 171 become the same potentials, so that the output signal of the NOR 171 is switched from the "L" level to the "H" level. As a result, the output signal of the first DFF 173 becomes from the "L" level to an "H" level, and the logic reset signal becomes from the "H" level to an "L" level.

In the control logic circuit 151 which has received the logic reset signal having the "L" level, a timing producing logic process operation is initialized which produces signals to be supplied to the magnetic field detecting circuit 105. In other words, the control logic circuit 151 is brought into a preparation condition in order to transfer the operation mode to the test mode. On the other hand, the level of the output signal of the second DFF 177, namely, the mode setting signal is switched from the "L" level to the "H" level, since the level of the output signal of the first DFF 173 rises from the "L" level to the "H" level, which is entered to the clock terminal of the second DFF 177.

Next, when such a setting condition is released by which both the common drain voltage of the output inverter circuit 113 and the common drain voltage of the output inverter circuit 161 are set to the "L" levels, the level of the output signal of the NOR 171 is switched from the "H" level to the "L" level. As a result, the output signal of the first DFF 173 becomes from the "H" level to the "L" level, and the logic reset signal becomes from the "L" level to the "H" level. In the control logic circuit 151 which has received the logic reset signal having the "H" level, the initialization as to the timing producing logic process operation is released, and furthermore, the level of the mode setting signal is kept in the "H" level, so that a timing producing logic process operation when the test mode is selected is commenced. The control logic circuit 151 which has received the mode setting signal having the "H" level produces a signal having a time period "TS" when the test mode is selected, which has been previously described, and then, provides the produced signal to the magnetic field detecting circuit 105.

The second DFF 177 which outputs the mode setting signal having the "H" level continuously outputs the mode setting signal having the "H" level until a signal having an "H" level is entered from the counter 163 employed inside the control logic circuit 151 to the reset terminal of this second DFF 177. If the signal having the "H" level is inputted to the reset terminal so that the second DFF 177 is reset, then the level of the mode setting signal is switched from the "H" level to the "L" level. As a result, the operation mode of the Hall IC 100 is returned to the normal mode.

As previously described, in accordance with the Hall IC 100 of the first embodiment mode, there is no possibility that both the common drain voltage of the output inverter circuit 113 and the common drain voltage of the output inverter circuit 161 are equal to the same potentials under the normal condition; both these common drain voltages are forcibly set to the "L" levels; and if this level setting operation is released, then the time period of the intermittent driving operation is shorter than that when the normal mode is set, so that the operation mode can be transferred to the test mode capable of performing the investigating operation within the short time. Also, in the Hall IC 100 of this first embodiment mode, no large change is made in the chip size and also no change is made in a total number of these terminals, as compared with the above-described Hall IC 10 shown in FIG. 16. Moreover, when the normal mode is selected, the intermittent driving operation is performed, the time period of which is longer than that when the test mode is selected, so that the power consumption of the Hall IC 100 is low. Also, since the operation mode is returned from the test mode to the normal mode after a predetermined time has passed when the operation mode was transferred to the test mode, an efficiency in the investigation stages can be improved.

Figure 7:
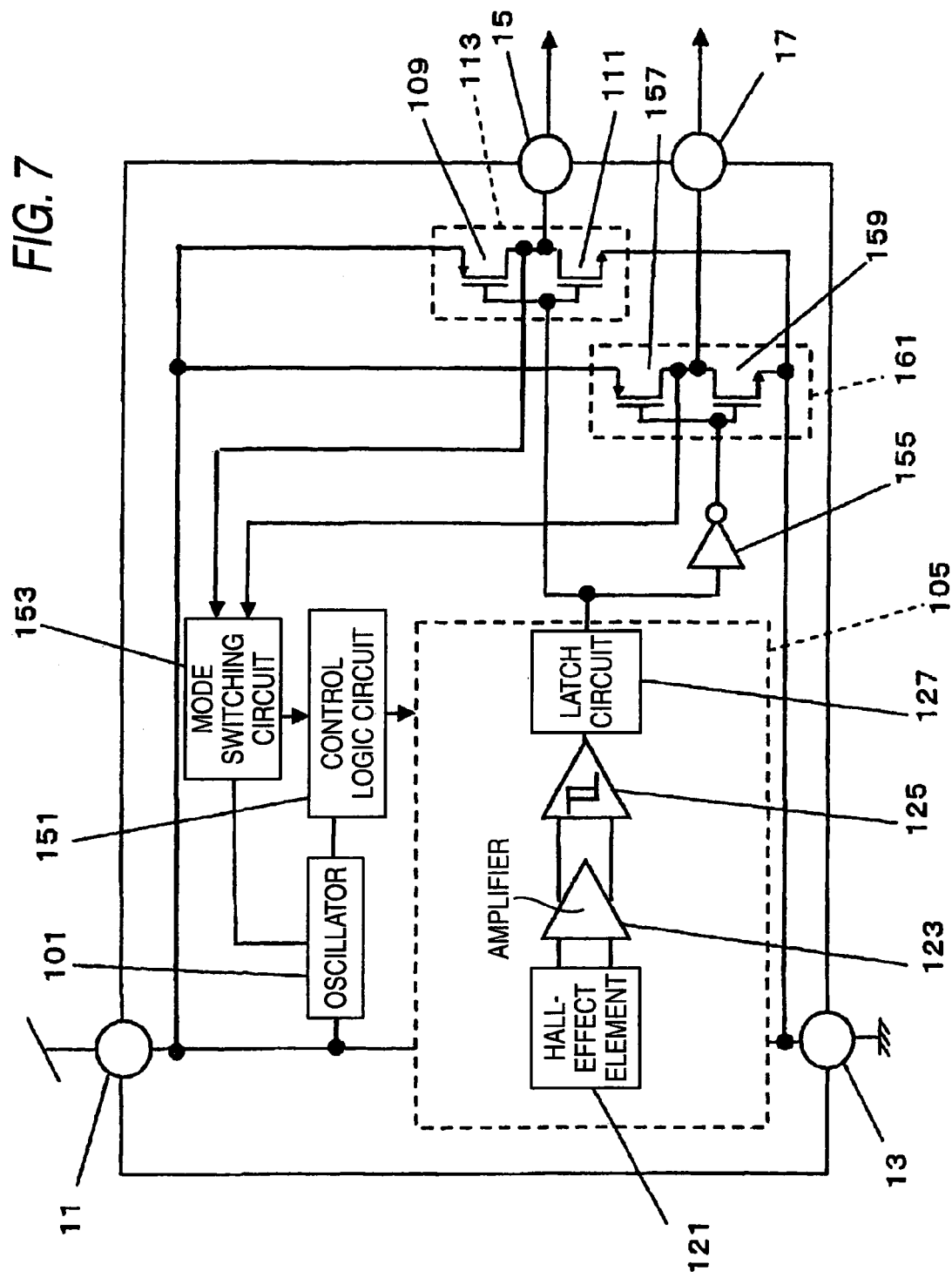
FIG. 7 is a block diagram for showing a Hall IC according to another embodiment mode of the present invention.

As another embodiment mode, as represented in FIG. 7, another output terminal 17 may be alternatively provided which has been connected to the common drain of the output inverter circuit 161 employed in the Hall IC 100 of the first embodiment mode. An inverted signal is outputted from the output terminal 17, which is produced by inverting the signal outputted from the output terminal 15.

Also, although the output inverter circuits 113 and 161 of the first embodiment mode have such an arrangement that both the NMOSs and the PMOSs have been series-connected to each other, these output inverter circuits 113 and 161 may be alternatively arranged by employing only NMOSs. Alternatively, a bipolar transistor may be employed instead of a MOS. It should also be noted that since a MOS having a large chip size can realize prevention of reverse flowing of a large current to the Hall IC 100, this MOS may have an effect capable of preventing a surge current, and the like.

Figure 8:
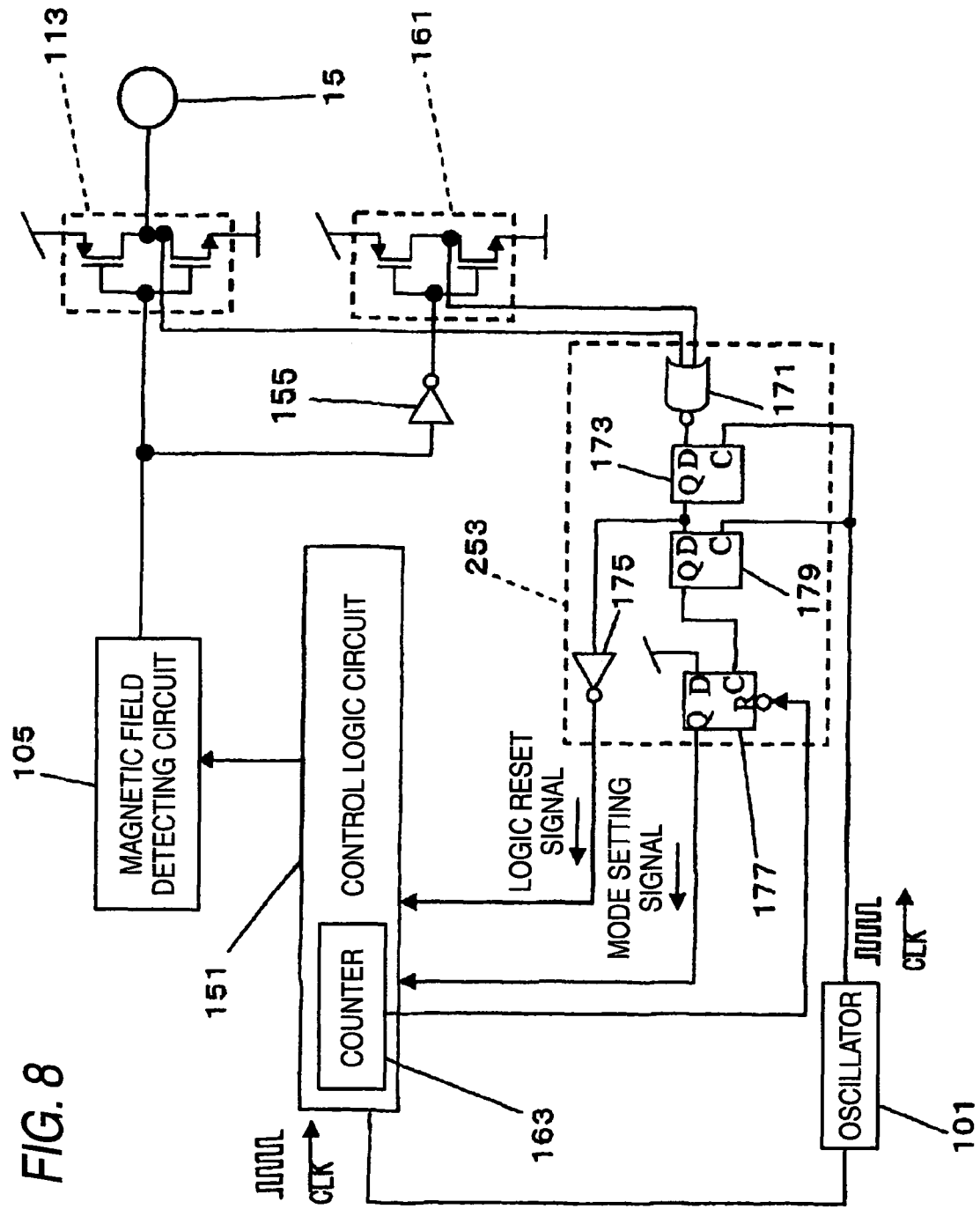
FIG. 8 is a block diagram for indicating a portion of the Hall IC 100 of the first embodiment mode, while an internal arrangement of a mode switching circuit 153 of another mode is mainly provided.

Alternatively, a mode switching circuit provided in the Hall IC 100 may be constructed with employment of an arrangement shown in FIG. 8. FIG. 8 is a block diagram for indicating a portion of the Hall IC 100 according to the first embodiment mode, while an internal arrangement of a mode switching circuit 253 of another embodiment mode is mainly represented. It should also be understood that in FIG. 8, the same reference numerals indicated in FIG. 6 have been applied to those for denoting the similar structural elements shown in FIG. 8. The mode switching circuit 253 shown in FIG. 8 is equipped with an NOR 171, a first DFF 173, a third D flip-flop (will be referred to as "third DFF" hereinafter) 179, an inverter 175, and a second DFF 177. It should also be understood that the second DFF 177 has a reset terminal. Two input potentials of the NOR 171 correspond to the common drain voltage of the output inverter circuit 113, and the common drain voltage of the output inverter circuit 161, respectively.

An output signal of the NOR 171 is inputted to the first DFF 173, and an output signal of the first DFF 173 is inputted to the inverter 175 and the third DFF 179. The output signal of the first DFF 173 which has been inverted by the inverter 175 is supplied as a logic reset signal to the control logic circuit 151. An output signal of the third DFF 179 is inputted to a clock terminal of the second DFF 177. An H-level potential is continuously applied to the input terminal of the second DFF 177. An output signal of the second DFF 177 is supplied as a mode setting signal to the control logic circuit 151, while the mode setting signal instructs setting of an operation mode. It should also be understood that the signal level of the mode setting signal when the normal mode is set is an "L" level, whereas the signal level of the mode setting signal when the test mode is set is an "H" level.

A signal supplied from a counter 163 provided inside the control logic circuit 151 is entered to a reset terminal of the second DFF 177. The counter 163 measures an elapsed time after the control logic circuit 151 has received the test signal having the "H" level, and then, the counter 163 outputs an H-level signal when a predetermined time has passed. When the H-level signal is inputted to the reset terminal, the second DFF 177 is reset.

The third DFF 179 plays a role as a latch circuit which latches the output signal of the first DFF 173. In other words, in order to transfer the operation mode to the test mode, if both the common drain voltage of the output inverter circuit 113 and the common drain voltage of the output inverter circuit 161 are forcibly set to "L" levels, then the signal level of the output signal from the NOR 171 is switched from the "L" level to the "H" level. As a result, the signal level of the output signal from the first DFF 173 becomes from the "L" level to the "H" level, and the signal level of the logic reset signal becomes from the "H" level to the "L" level. The output signal of the first DFF 173 is inputted to the third DFF 179, and the third DFF 179 outputs such a signal having the same level as that of the output signal from the first DFF 173 at a time instant when 1 time period of the clock signal has elapsed. As a consequence, timing at which the logic reset signal is inputted to the control logic circuit 151 always occurs prior to such a timing at which the mode setting signal is inputted to the control logic circuit 151. Operations of the second DFF 177 are similar to those of the mode switching circuit 153 shown in FIG. 6.

As previously described, the third DFF 179 is employed between the first DFF 173 and the second DFF 177, so that the starting timing when the timing producing logic process operation is started in the test mode in response to the mode setting signal occurs after the initializing timing when the timing producing process logic process operation is initialized in response to the logic reset signal. As a result, it is possible to avoid an unexpected event which may occur since the logic reset signal and the mode setting signal are produced in erroneous production timing.

Figure 9:
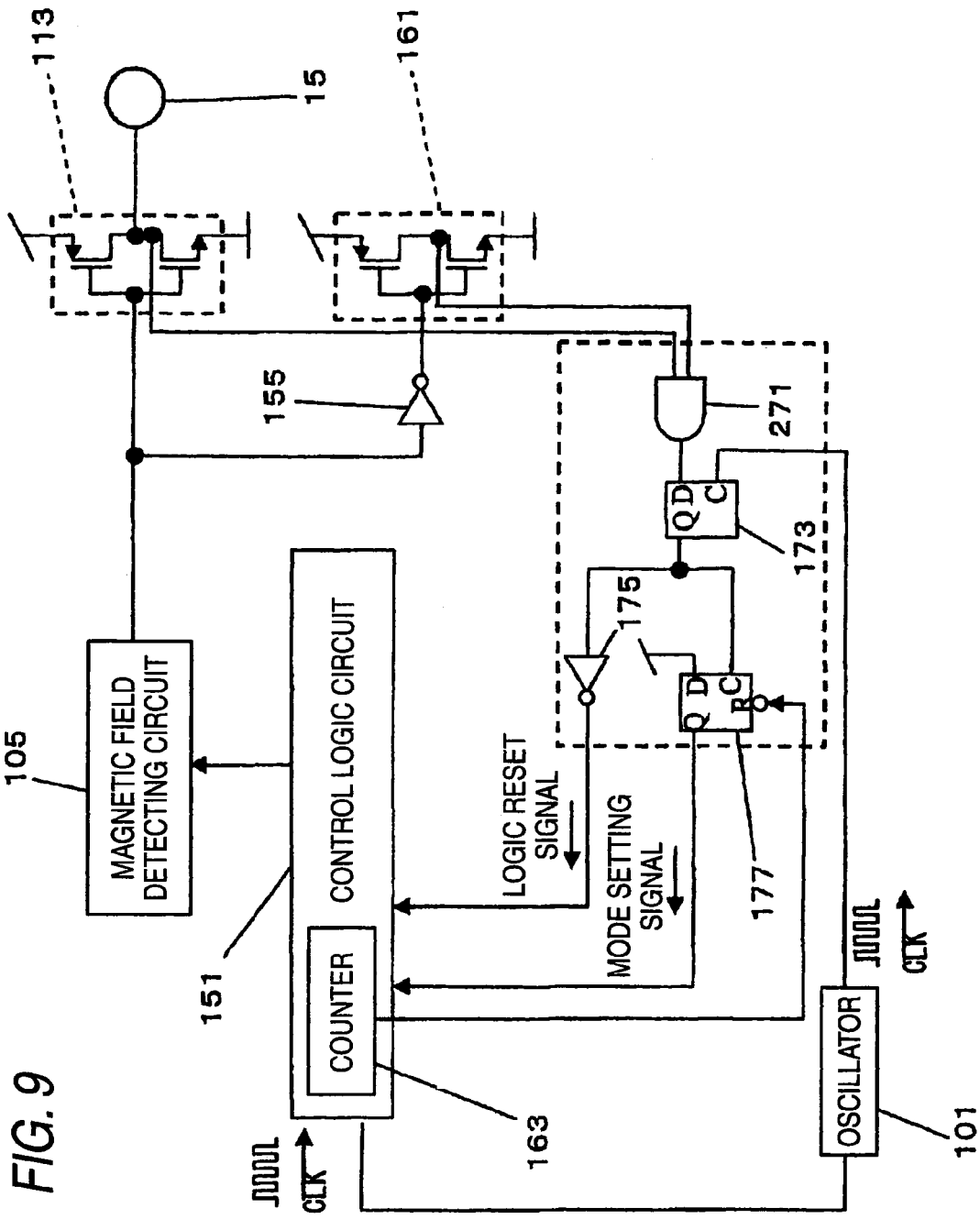
FIG. 9 is a block diagram for indicating a portion of the Hall IC 100 of the first embodiment mode, while an internal arrangement of a mode switching circuit 153 of another mode is mainly provided.
Figure 10:
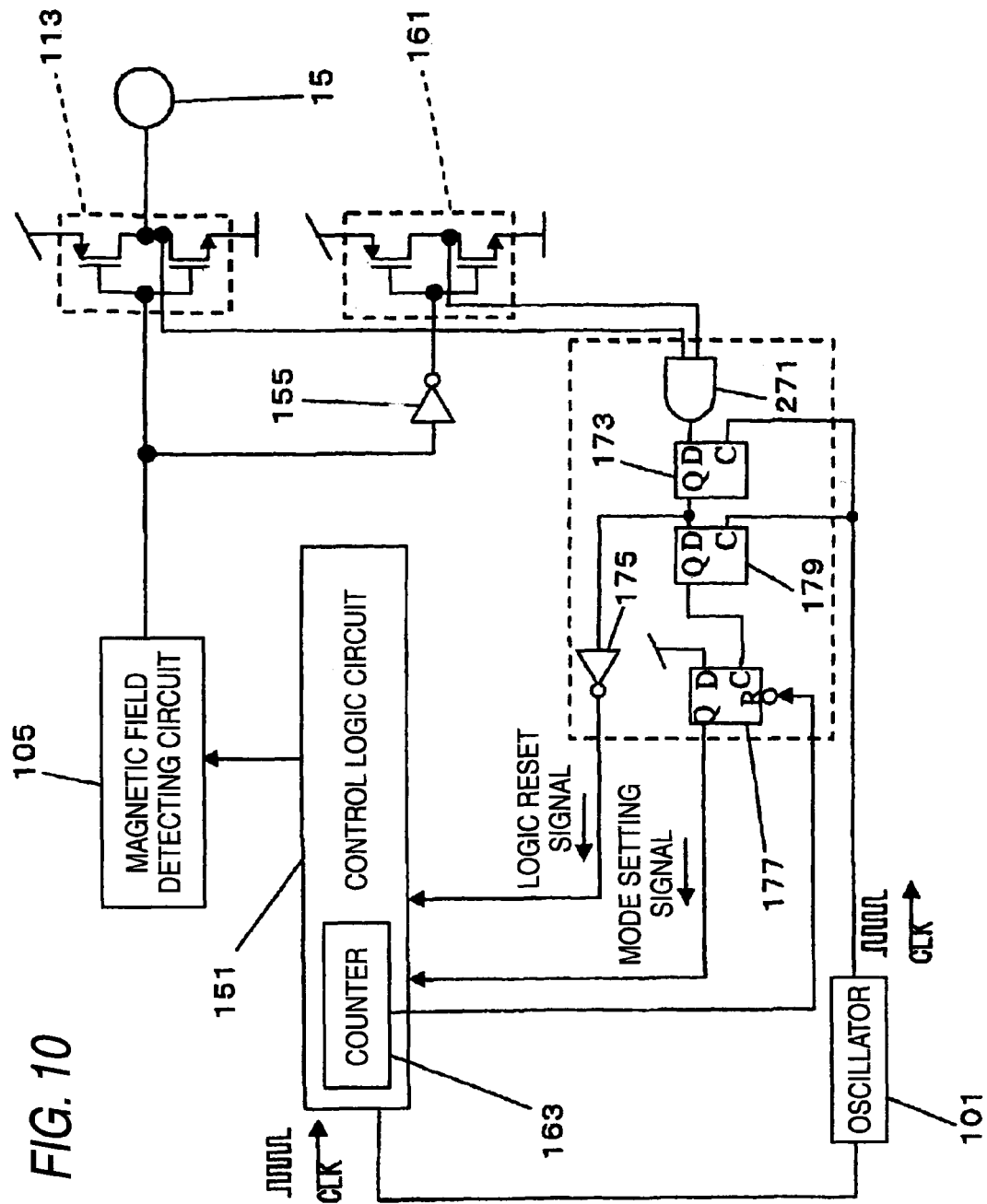
FIG. 10 is a block diagram for indicating a portion of the Hall IC 100 of the first embodiment mode, while an internal arrangement of a mode switching circuit 153 of another mode is mainly provided.

Although the mode switching circuits 153 and 253 shown in FIG. 6 and FIG. 8 have the NORs 171, AND gates 271 may be alternatively employed instead of the NORs 171 as shown in FIG. 9 and FIG. 10. It should also be noted that when the operation mode is transferred to the test mode, both the common drain voltage of the output inverter circuit 113 and the common drain voltage of the output inverter circuit 161 are forcibly set to "H" levels. At this time, a signal level of an output signal from the AND gate 271 is switched from an "L" level to an "H" level, and subsequent operations are similar to those of the mode switching circuits 153 and 253 represented in FIG. 6 and FIG. 8.

Second Embodiment Mode

Figure 11:
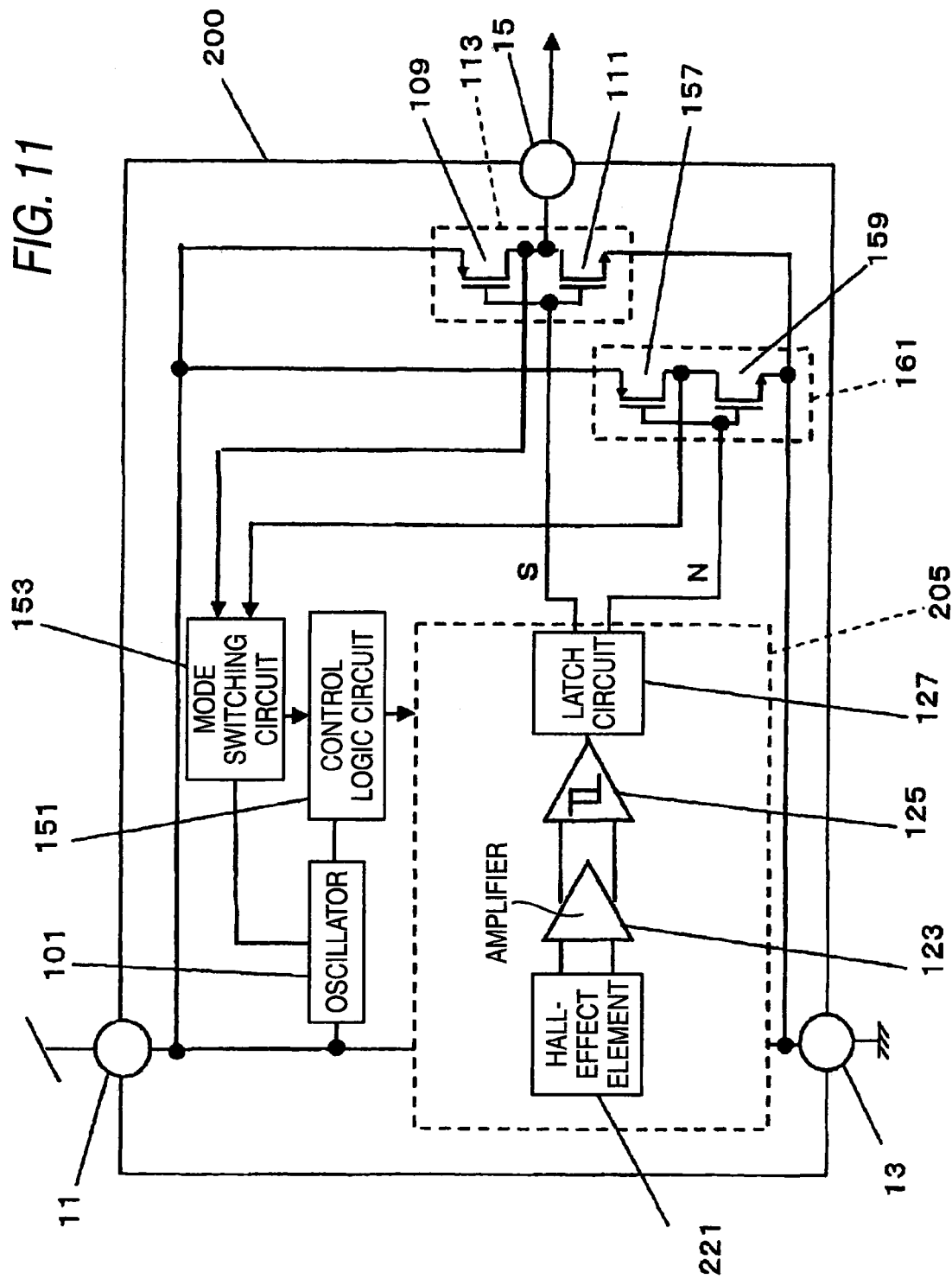
FIG. 11 is a block diagram for showing a Hall IC 200 according to a second embodiment mode of the present invention.

FIG. 11 is a block diagram for showing a Hall IC 200 according to a second embodiment mode of the present invention. The Hall IC 200 of the second embodiment mode has the below-mentioned different points, as compared with those of the Hall IC 100 of the first embodiment mode: That is, the Hall IC 200 is equipped with an output terminal connected to the common drain of the output inverter circuit 161; the Hall IC 200 is not provided with the above-described inverter 155; and a magnetic field detecting circuit 205 separately outputs a Hall voltage (will be referred to as "S-pole Hall voltage" hereinafter) in response to magnetic flux density (otherwise magnetic field) of an S pole, and another Hall voltage (will be referred to as "N-pole Hall voltage" hereinafter) in response to magnetic flux density (otherwise magnetic field) of an N pole, the S-pole Hall voltage is applied to the common gate of the output inverter circuit 113, and also, the N-pole Hall voltage is applied to the common gate of the output inverter circuit 161. Other structural elements employed in the second embodiment mode are similar to those of the first embodiment mode. The same reference numerals shown in FIG. 1 have been employed as those for denoting the similar structural elements indicated in FIG. 11.

It should be understood that while a Hall-effect element 221 employed in the magnetic field detecting circuit 205 has an S-pole detecting phase and an N-pole detecting phase, since these two phases are switched, when the S-pole detecting phase is selected, the S-pole Hall voltage is applied to the common gate of the output inverter circuit 113, whereas when the N-pole detecting phase is selected, the N-pole Hall voltage is applied to the common gate of the output inverter circuit 161.

Figure 12:
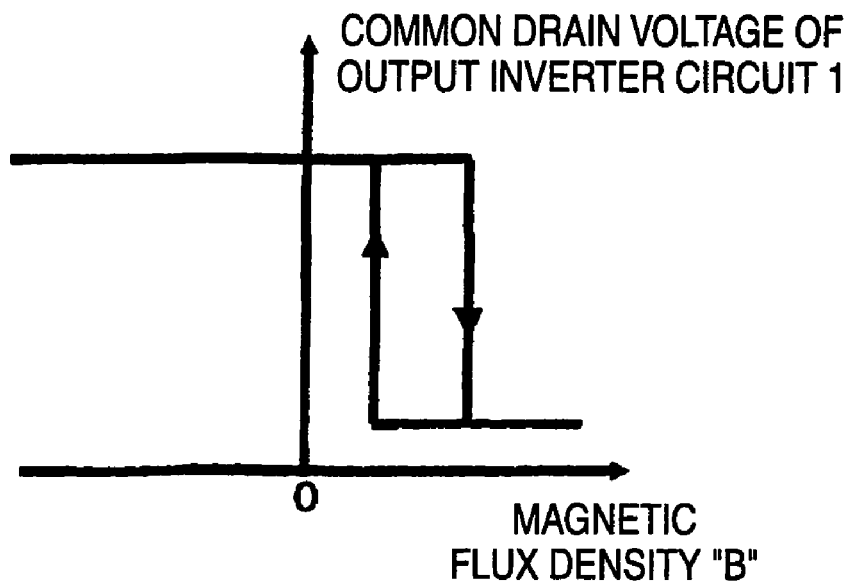
FIG. 12 is a diagram for representing a characteristic of a common drain voltage of an output inverter circuit 113 in response to magnetic flux density "B."
Figure 13:
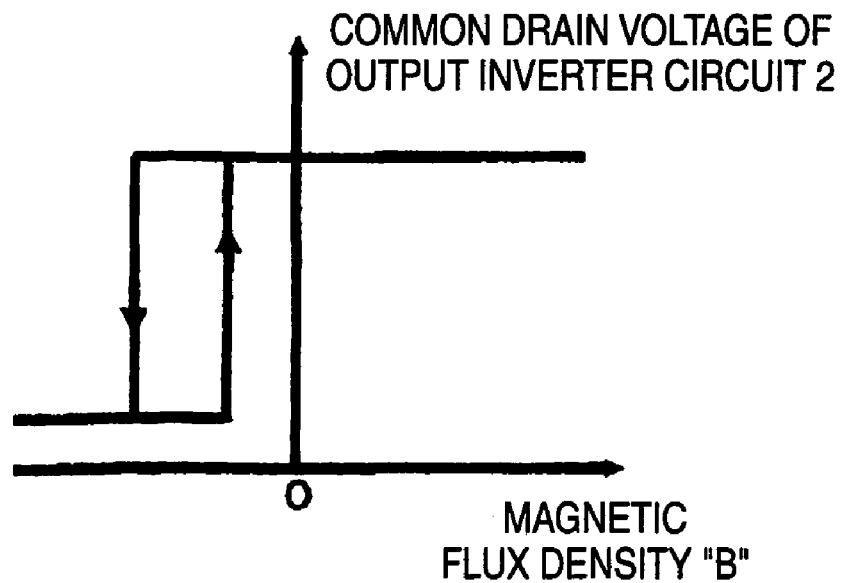
FIG. 13 is a diagram for representing a characteristic of a common drain voltage of an output inverter circuit 161 in response to magnetic flux density "B."

FIG. 12 is a diagram for representing a characteristic of the common drain voltage of the output inverter circuit 113 in response to the magnetic flux density "B." Also, FIG. 13 is a diagram for indicating a characteristic of the common drain voltage of the output inverter circuit 161 in response to the magnetic flux density "B." Ordinates of graphs shown in FIG. 12 and FIG. 13 represent the common drain voltages, whereas abscissa thereof represent the magnetic flux density "B." It should also be noted that plus directions of the ordinates correspond to the S pole, and minus directions thereof correspond to the N pole. Due to the hysteresis function of the hysteresis comparator 125 contained in the magnetic field detecting circuit 205, the above-described common drain voltage of the output inverter circuit 113 has such a characteristic represented in FIG. 12, and also, the common drain voltage of the output inverter circuit 161 has a characteristic represented in FIG. 13.

In accordance with the Hall IC 200 of the second embodiment mode, there is no possibility that both the common drain voltage of the output inverter circuit 113 and the common drain voltage of the output inverter circuit 161 are equal to the same potentials under the normal condition. As a result, as explained in the first embodiment mode, both these common drain voltages are forcibly set to the "L" levels; and if this level setting operation is released, then the time period of the intermittent driving operation is shorter than that when the normal mode is set, so that the operation mode can be transferred to the test mode capable of performing the investigating operation within the short time.

Similarly, in the second embodiment mode, the transistors which constitute the output inverter circuits 113 and 161 may be realized as MOSs, or bipolar transistors. Also, logic gates to which the common drain voltage of the output inverter circuit 113 and the common drain voltage of the output inverter circuit 161 employed in the mode switching circuit 153 may be realized as NORs, or ANDs.

Also, similar to the first embodiment mode, the mode switching circuit 153 may be realized by employing not only the structure shown in FIG. 6, but also the structures indicated in FIG. 8 to FIG. 10.

Third Embodiment Mode

Figure 14:
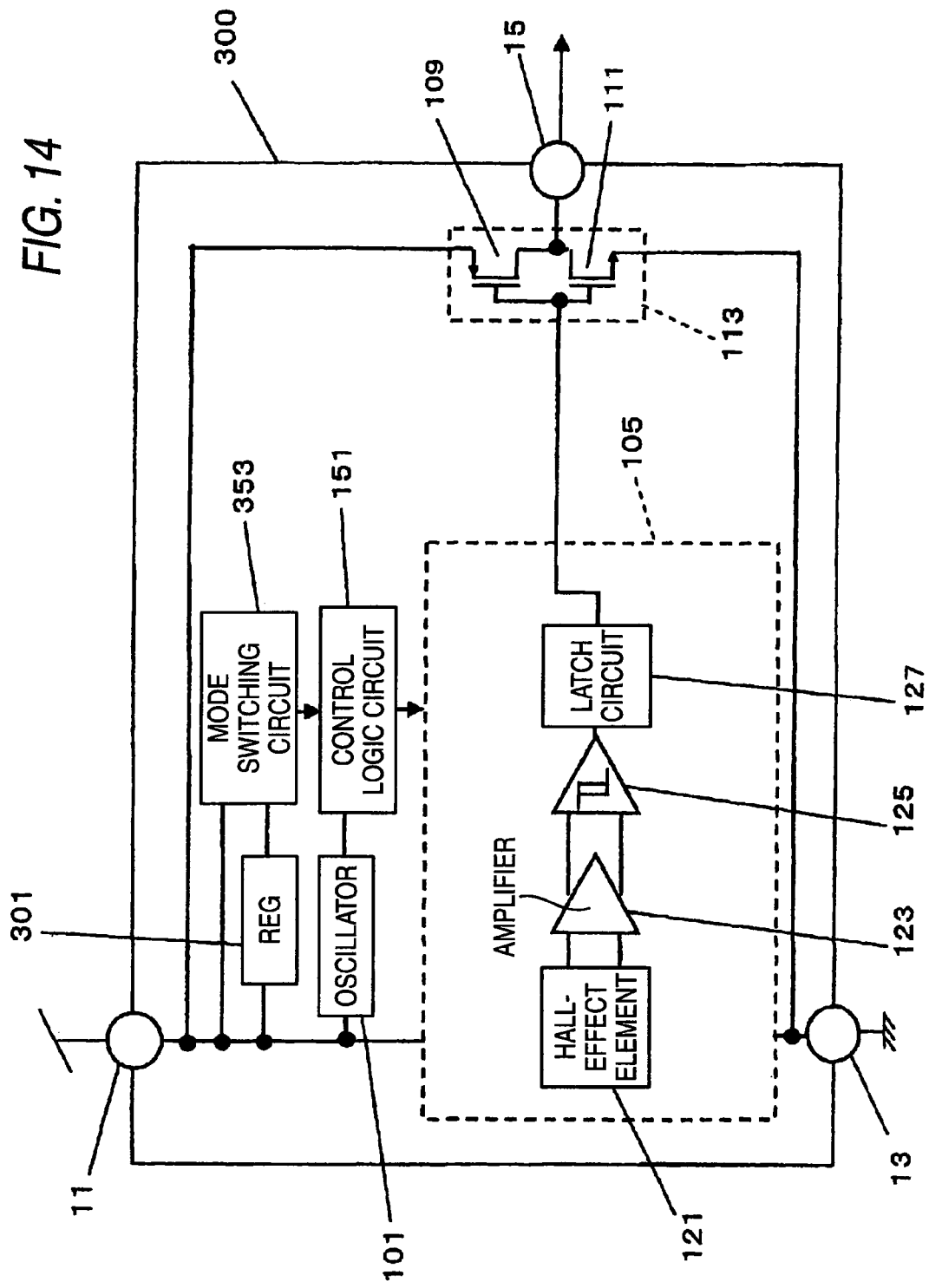
FIG. 14 is a block diagram for showing a Hall IC 300 according to a third embodiment mode of the present invention.

FIG. 14 is a block diagram for showing a Hall IC 300 according to a third embodiment mode of the present invention. As indicated in FIG. 14, similar to the first embodiment mode, the Hall IC 300 of the third embodiment mode is equipped with a power supply terminal 11, a GND terminal 13, an output terminal 15, an oscillator 101, a control logic circuit 151, a magnetic field detecting circuit 105, an output inverter circuit 113, a mode switching circuit 353, and a reference voltage generating unit 301. The Hall IC 300 of the third embodiment mode is not equipped with the above-described inverter 155, but also, the mode switching circuit 353 has not been connected to the common drain of the output inverter circuit 113.

Figure 15:
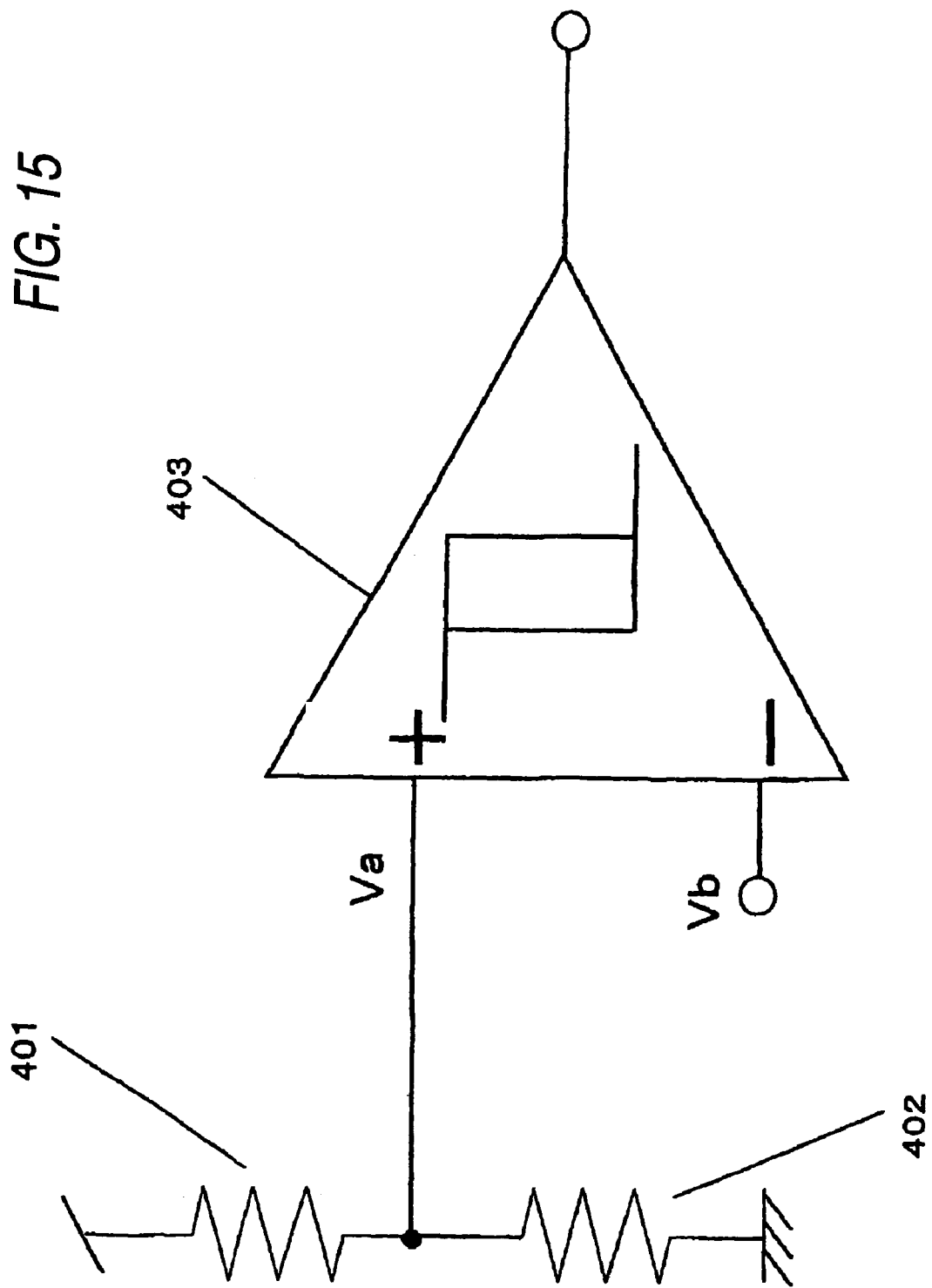
FIG. 15 is a circuit diagram for showing a mode switching circuit 353 provided in the Hall IC 300 of the third embodiment mode.

FIG. 15 is a circuit diagram for showing the mode switching circuit 353 provided in the Hall IC 300 of the third embodiment mode. As indicated in FIG. 15, the mode switching circuit 353 of this third embodiment mode contains resistors 401 and 402, and a comparator with a hysteresis characteristic (will be referred to as "hysteresis comparator" hereinafter) 403. The resistors 401 and 402 divide power supply voltage "Vcc" applied from the power supply terminal 11. A voltage-divided potential "Va" obtained by dividing the power supply voltage "Vcc" by the resistors 401 and 402 is applied to a non-inverting input terminal(+) of the hysteresis comparator 403, and a reference potential "Vb" generated by the reference voltage generator 301 is applied to an inverting input terminal(−) thereof.

The hysteresis comparator 403 compares the voltage-divided potential "Va" with the reference potential "Vb" so as to output a signal having such a level in response to large/small relationship between the voltage-divided potential "Va" and the reference voltage "Vb", and the hysteresis characteristic, namely to output either a signal having an "H" level or a signal having an "L" level. The output signal of the hysteresis comparator 403 is supplied to the control logic circuit 151, and then, the control logic circuit 151 switches an operation mode in response to a level of this supplied signal. Concretely speaking, when the level of the signal is the "L" level, the control logic circuit 151 sets the normal mode in which the time period for the magnetic field detecting intermittent operation is long, whereas when the level of the signal is the "H" level, the control logic circuit 151 sets the test mode in which the time period for the magnetic field detecting intermittent operation is short.

In accordance with the third embodiment mode, in the normal mode, the power supply voltage, the voltage dividing ratio defined by the resistors 401 and 402, and the reference potential "Vb" are set in such a manner that such a relationship of Va<Vb can be satisfied. When the relationship Va<Vb can be satisfied, the hysteresis comparator 403 outputs the signal having the "L" level.

When the operation mode of the Hall IC 300 of the third embodiment mode is switched to the test mode, the power supply voltage "Vcc" to be applied to the power supply terminal 11 is increased. IF the power supply voltage "Vcc" is increased, so that the voltage relationship of Va>Vb can be satisfied, then the hysteresis comparator 403 outputs the signal having the "H" level. As a result, the control logic circuit 151 sets the time period for the magnetic field detecting intermittent operation to the test mode. Under such a condition that the hysteresis comparator 403 is outputting the signal having the "H" level, the hysteresis comparator 403 holds the "H"-level output due to the hysteresis operation within such a range capable of satisfying relationship of (Va+Vo) >Vb. On the other hand, if the power supply voltage "Vcc" is decreased, so that the voltage relationship of (Va+Vo)<Vb can be satisfied, then the hysteresis comparator 403 outputs the signal having the "L" level. As a result, the control logic circuit 151 sets the time period for the magnetic field detecting intermittent operation to the normal mode.

As previously described, in accordance with the Hall IC 300 of the third embodiment mode, the level of the power supply voltage "Vcc" applied to the power supply terminal 11 is adjusted, so that the operation modes whose intermittent driving time periods are different from each other can be switched. As a consequence, similar to the first embodiment mode, while the Hall IC 300 has the same chip size and the same total number of terminals as those of the conventional Hall IC, the operation mode of the Hall IC 300 can be transferred to the test mode capable of performing the investigating operation within the short time.

The above-described Hall ICs of the first to third embodiment modes are mounted on electronic appliances such as portable telephones.

The magnetic field detecting apparatus related to the present invention is useful as a Hall IC, and the like, which can perform an investigating operation within a short time, and whose power consumption is low.

What is claimed is:

1. A magnetic field detecting apparatus comprising:
   a magnetic field detecting unit, energized in response to a potential level of an input signal and outputting any one of two signals having different potential levels from each other in response to a peripheral magnetic field;
   an energizing control unit, producing a periodic energizing control signal indicative of timing at which said magnetic field detecting unit is energized by employing a clock signal and another signal obtained by frequency-dividing or frequency-multiplying said clock signal, the energizing control unit supplying said produced energizing control signal to said magnetic field detecting unit;
   a first inverting unit, inverting the potential level of the output signal of said magnetic field detecting unit; and
   an energizing time period control unit, supplying a time period control signal to said energizing control unit, said time period control signal controlling the time period of said energizing control signal in response to the potential level of the output signal of said magnetic field detecting unit and the potential level of the signal obtained by inverting the potential level of said output signal by said first inverting unit;
   wherein said energizing time period control unit supplies any one of two pieces of said energizing control signals whose durations and time periods are different from each other, during which said magnetic field detecting unit is not energized, in response to the potential level of said time period control signal supplied from said energizing time period control unit.

2. The magnetic field detecting apparatus as claimed in claim 1, wherein:
   as operation modes of said magnetic field detecting apparatus, a test mode when the operation of said magnetic field detecting apparatus is investigated, and a normal mode when said magnetic field detecting apparatus is operated under normal condition are prepared; and wherein:
   both a non-energizing duration and a time period of said energizing control signal when said test mode is selected are shorter than those of said energizing control signal when said normal mode is selected.

3. The magnetic field detecting apparatus as claimed in claim 2, wherein:
   both a signal responding to the potential level of the output signal from said magnetic field detecting unit, and another signal responding to the potential level of the signal obtained by inverting the potential level of said output signal by said first inverting unit are inputted to said energizing time period control unit; and
   when the potential levels of said two signals entered to said energizing time period control unit are forcibly set to the same potential only for a predetermined time during said normal mode, said energizing time period control unit supplies a time period control signal having a potential level which is different from the potential level of said time period control signal during said normal mode to said energizing control unit, so that the operation mode of said magnetic field detecting apparatus is transferred from said normal mode to said test mode.

4. A magnetic field detecting apparatus comprising:
   a magnetic field detecting unit, energized in response to a potential level of an input signal, and outputting any one of two signals having different potential levels from each other in response to a peripheral magnetic field of an S pole, and outputting any one of the two signals having the different potential levels from each other in response to a peripheral magnetic field of an N pole;
   an energizing control unit, producing a periodic energizing control signal indicative of timing of which said magnetic field detecting unit is energized by employing a clock signal and another signal obtained by frequency-dividing or frequency-multiplying said clock signal, the energizing control unit supplying said produced energizing control signal to said magnetic field detecting unit; and
   an energizing time period control unit, supplying a time period control signal to said energizing control unit, said time period control signal controlling the time period of said energizing control signal in response to both the potential level of the output signal of said magnetic field detecting unit, which responds to the magnetic field of the S pole, and the potential level of the signal of said magnetic field detecting unit, which responds to the magnetic field of the N pole; and wherein:
   said energizing time period control unit supplies any one of two pieces of said energizing control signals whose durations and time periods are different from each other, during which said magnetic field detecting unit is not energized in response to the potential level of said time period control signal supplied from said energizing time period control unit.

5. The magnetic field detecting apparatus as claimed in claim 4, wherein:
as operation modes of said magnetic field detecting apparatus, a test mode when the operation of said magnetic field detecting apparatus is investigated, and a normal mode when said magnetic field detecting apparatus is operated under normal condition are prepared; and wherein:
both a non-energizing duration and a time period of said energizing control signal when said test mode is selected are shorter than those of said energizing control signal when said normal mode is selected.

6. The magnetic field detecting apparatus as claimed in claim 5, wherein:
both a signal responding to the potential level of the output signal from said magnetic field detecting unit, which is produced in response to the magnetic field of the S pole, and another signal responding to the potential level of the output signal from said magnetic field detecting unit, which is produced in response to the magnetic field of the N pole are inputted to the energizing time period control unit; and wherein:
when the potential levels of said two signals entered to said energizing time period control unit are forcibly set to the same potential only for a predetermined time during said normal mode, said energizing time period control unit supplies a time period control signal having a potential level which is different from the potential level of said time period control signal during said normal mode to said energizing control unit, so that the operation mode of said magnetic field detecting apparatus is transferred from said normal mode to said test mode.

7. The magnetic field detecting apparatus as claimed in claim 3, or claim 6, wherein:
said energizing control unit includes a counter for measuring a time elapsed after the operation mode of said magnetic field detecting apparatus has been transferred to said test mode; and when a predetermined time has elapsed, said energizing control unit initializes said energizing time period control unit.

8. The magnetic field detecting apparatus as claimed in claim 7, wherein:
said energizing time period control unit is comprised of:
a logic gate for outputting a signal having an "H" level when the potential levels of said two signals entered to said energizing time period control unit are set to the same potentials;
a first flip-flop having an input terminal into which the signal outputted from said logic gate is entered;
a second inverting unit for inverting a potential level of a signal outputted from said first flip-flop; and
a second flip-flop having a reset terminal, a clock terminal into which the output signal of said first flip-flop is inputted, and an input terminal into which the "H"-level signal is continuously inputted; and wherein:
said time period control signal is an output signal of said second flip-flop.

9. A magnetic field detecting apparatus as claimed in claim 5, wherein:
the production of said energizing control signal by said energizing control unit is initialized, or the initializing operation thereof is released in response to a potential level of a signal obtained by inverting the potential level of the output signal of said first flip-flop by said second inverting unit.

10. A magnetic field detecting apparatus as claimed in claim 8, wherein:
said logic gate is a NOR gate, or an AND gate.

11. The magnetic field detecting apparatus as claimed in claim 7, wherein:
said energizing time period control unit is comprised of:
a logic gate for outputting a signal having an "H" level when the potential levels of said two signals entered to said energizing time period control unit are set to the same potentials;
a first flip-flop having an input terminal into which the signal outputted from said logic gate is entered;
a second inverting unit for inverting a potential level of a signal outputted from said first flip-flop;
a second flip-flop having an input terminal into which the output signal of said first flip-flop is entered; and
a third flip-flop having a reset terminal, a clock terminal into which the output signal of said second flip-flop is inputted, and an input terminal into which the "H"-level signal is continuously inputted; and wherein:
said time period control signal is an output signal of said third flip-flop.

12. A magnetic field detecting apparatus as claimed in claim 11, wherein: the production of said energizing control signal by said energizing control unit is initialized, or the initializing operation thereof is released in response to a potential level of a signal obtained by inverting the potential level of the output signal of said first flip-flop by said second inverting unit.

13. A magnetic field detecting apparatus as claimed in claim 11, wherein: said logic gate is a NOR gate, or an AND gate.

14. An electronic appliance comprising:
the magnetic field detecting apparatus recited in claim 1 or claims 4.

15. A magnetic field detecting apparatus comprising:
a magnetic field detecting unit which is energized in response to a potential level of an input signal, and outputs any one of two signals having different potential levels from each other in response to a peripheral magnetic field;
an energizing control unit for producing a periodic energizing control signal indicative of timing of which said magnetic field detecting unit is energized by employing a clock signal and another signal obtained by frequency-dividing, or frequency-multiplying said clock signal, and for supplying said produced energizing control signal to said magnetic field detecting unit; and
a comparing unit for comparing a potential responding to a power supply voltage with a reference potential, and for outputting any one of two signals having different potential levels from each other in response to large/small relationship between said potential and said reference potential; wherein:
said energizing time period control unit supplies any one of two pieces of said energizing control signals whose durations and time periods are different from each other, during which said magnetic field detecting unit is not energized in response to the potential level of said signal outputted from said comparing unit.

16. A magnetic field detecting apparatus as claimed in claim 15, wherein:
as operation modes of said magnetic field detecting apparatus, a test mode when the operation of said magnetic field detecting apparatus is investigated, and a normal mode when said magnetic field detecting apparatus is operated under normal condition are prepared; and wherein:

both a non-energizing duration and a time period of said energizing control signal when said test mode is selected are shorter than those of said energizing control signal when said normal mode is selected.

17. The magnetic field detecting apparatus as claimed in claim 16, wherein:

a power supply voltage during said test mode is higher than a power supply voltage during said normal mode; and wherein:

when a potential responding to said power supply voltage becomes higher than said reference potential, the operation mode of said magnetic field detecting apparatus is transferred from said normal mode to said test mode.

* * * * *